(12) United States Patent
Bakir et al.

(10) Patent No.: US 7,266,267 B2
(45) Date of Patent: Sep. 4, 2007

(54) MICROFLUIDIC, OPTICAL, AND ELECTRICAL INPUT OUTPUT INTERCONNECTS, METHODS OF FABRICATION THEREOF, AND METHODS OF USE THEREOF

(75) Inventors: Muhannad S. Bakir, Atlanta, GA (US); James D. Meindl, Marietta, GA (US)

(73) Assignee: Georgia Tech Research Corp., Atlanta, GA (US)

(*) Notice: Subject to any disclaimer, the term of this patent is extended or adjusted under 35 U.S.C. 154(b) by 0 days.

(21) Appl. No.: 11/261,149

(22) Filed: Oct. 28, 2005

(65) Prior Publication Data

US 2006/0104566 A1    May 18, 2006

Related U.S. Application Data

(60) Provisional application No. 60/628,406, filed on Nov. 16, 2004.

(51) Int. Cl.
   *G02B 6/26* (2006.01)
(52) U.S. Cl. .......................... 385/31; 385/39
(58) Field of Classification Search ............ 385/50, 385/92–94, 129–132; 439/577; 264/1.24
   See application file for complete search history.

(56) References Cited

U.S. PATENT DOCUMENTS

| | | | |
|---|---|---|---|
| 4,380,365 A | 4/1983 | Gross | 350/96.18 |
| 5,046,800 A | 9/1991 | Blyler, Jr. et al. | 385/131 |
| 5,130,356 A | 7/1992 | Feuerherd et al. | 524/96 |
| 5,239,189 A * | 8/1993 | Lawrence | 257/81 |
| 5,302,656 A | 4/1994 | Kohara et al. | 524/579 |
| 5,359,208 A | 10/1994 | Katsuki et al. | 257/82 |
| 5,434,196 A | 7/1995 | Ohkawa et al. | 522/100 |
| 5,436,411 A * | 7/1995 | Pasch | 174/261 |
| 5,462,995 A | 10/1995 | Hosaka et al. | 525/332.1 |
| 5,581,414 A | 12/1996 | Snyder | 359/819 |
| 5,896,479 A | 4/1999 | Vladic | 385/59 |
| 6,022,498 A | 2/2000 | Buazza et al. | 264/1.38 |
| 6,039,897 A | 3/2000 | Lochhead et al. | 264/1.24 |
| 6,156,394 A | 12/2000 | Schultz Yamasaki et al. | 427/536 |
| 6,206,673 B1 | 3/2001 | Lipscomb et al. | 425/174.4 |
| 6,253,004 B1 | 6/2001 | Lee et al. | 385/31 |
| 6,259,567 B1 | 7/2001 | Brown et al. | 359/668 |
| 6,262,414 B1 | 7/2001 | Mitsuhashi | 250/216 |
| 6,272,275 B1 | 8/2001 | Cortright et al. | 385/129 |
| 6,281,508 B1 | 8/2001 | Lee et al. | 250/396 |
| 6,432,328 B2 | 8/2002 | Hamanaka et al. | 264/1.36 |
| 6,500,603 B1 | 12/2002 | Shioda | 430/321 |
| 6,790,325 B2 * | 9/2004 | Gates et al. | 204/281 |

(Continued)

OTHER PUBLICATIONS

Chen, et al.; Fully Embedded Board-Level Guided-Wave Optoelectronic Interconnects; Jun. 2000; Proceedings of IEEE, vol. 88, No. 6; pp. 780-793.

(Continued)

*Primary Examiner*—Brian Healy
*Assistant Examiner*—Charlie Peng
(74) *Attorney, Agent, or Firm*—Thomas, Kayden, Horstemeyer & Risley, LLP

(57) ABSTRACT

Input/output (I/O) interconnects, fluidic I/O interconnects, electrical, optical, and fluidic I/O interconnects, devices incorporating the I/O interconnects, systems incorporating the I/O interconnects, and methods of fabricating the I/O interconnects, devices, and systems, are described herein.

52 Claims, 10 Drawing Sheets

U.S. PATENT DOCUMENTS

| | | | |
|---|---|---|---|
| 7,001,658 B2 * | 2/2006 | Bourdelais et al. | 428/188 |
| 7,068,866 B2 * | 6/2006 | Wang et al. | 385/10 |
| 7,070,207 B2 * | 7/2006 | Asai | 285/14 |
| 7,092,603 B2 * | 8/2006 | Glebov et al. | 385/51 |
| 2002/0100714 A1 * | 8/2002 | Staats | 210/85 |
| 2004/0067009 A1 * | 4/2004 | Scholz et al. | 385/16 |
| 2005/0257709 A1 * | 11/2005 | Mule et al. | 101/494 |
| 2006/0024002 A1 * | 2/2006 | Roth et al. | 385/88 |
| 2006/0049525 A1 * | 3/2006 | Lin et al. | 257/758 |

OTHER PUBLICATIONS

Wiesmann, et al.; Singlemode Polymer Waveguides for Optical Backplanes; Dec. 5, 1996; Electronics Letters, vol. 32, No. 25; pp. 2329-2330.

Barry, et al.; Highly Efficient Coupling Between Single-Mode Fiber and Polymer Optical Waveguides; Aug. 1997; IEEE Transactions on Components, Packaging, and Manufacturing Technology—Part B, vol. 20, No. 3; pp. 225-228.

Lee, et al.; Fabrication of Polymeric Large-Core Waveguides for Optical Interconnects Using a Rubber Molding Process; Jan. 2000; IEEE Photonics Technology Letters, vol. 12, No. 1; pp. 62-64.

Schmeider, et al.; Electro-Optical Printed Circuit Board (EOPCB); 2000 Electronic Components and Technoogy Conference; pp. 749-753.

Mederer, et al.; 3Gb/s Data Transmission With GaAs VCSELs Over PCB Integrated Polymer Waveguides; Sep. 2001; IEEE Photonics Technology Letters. vol. 13, No. 9; pp. 1032-1034.

Schröder, et al.; Polymer Optical Interconnects for PCB; 2001; Session 13: Photonic Polymers II; pp. 337-343.

Glukh, et al.; High performance Polymeric Materials for Waveguide Applications; Aug. 2000; SPIE—The International Society for Optical Engineering, inear, Nonlinear, and Power Limiting Organics, San Diego, vol. 4106; pp. 1-11.

Liu, et al.; Plastic VCSEL Array Packaging and High Density Polymer Waveguides for Board and Backplane Optical Interconnect; 1998; Electronic Components and Technology Conference; pp. 999-1005.

Bakir, et al.; Sea of Dual Mode Polymer Pillar I/O Interconnections for Gigascale Integration; 2003; IEEE International Solid State Circuits Conference; 8 pages.

Beuret, et al.; Microfabrication of 3D Multidirectional Inclined Structure by UV lithography and Electroplating; Micro Electro Mechanical Systems, 1994, MEMS'94, Proceedings, IEEE Workshop on Jan. 25-28, 1994; pp. 81-85.

Wang, et al.; Studies on A Novel Flip-Chip Interconnect Structure-Pillar Bump; Electronic Components and Technology Conference, 2001, Proceedings, 51st, May 29-Jun. 1, 2001; pp. 945-949.

Bakir, et al.; Sea of Polymer Pillars: Dual-Mode Electrical Optical Input/Output Interconnections; in Proc. of Int. Interconnect Technology Conference; pp.77-79; 2003.

Bakir, et al.; Sea of Polymer Pillars: Compliant Wafer-Level Electrical-Optical Chip I/O Interconnections; IEEE Photonics Technology Letters, vol. 15, No. 11, Nov. 2003; pp. 1567-1569.

Bakir, et al.; Optical Transmission of Polymer Pillars for Chip I/O Optical Interconnections; IEEE Photonics Technology Letters, vol. 16, No. 1, Jan. 2004; pp. 117-119.

Chandrasekhar, et al.; Modeling and Characterization of the Polymer Stud Grid Array (PSGA) Package: Electrical, Thermal and Thermo-Mechanical Qualification; IEEE Transactions on Electronics Packaging Manufacturing, vol. 26, No. 1, Jan. 2003; pp. 54-67.

Bakir, et al; Sea of Polymer Pillars Electrical and Optical Chip I/O Interconnections for Gigascale Integration; IEEE Transactions on Electron Devices; vol. 51, No. 7; Jul. 2004; pp. 1069-1077.

Bakir, et al.; Integration of Optical Polymer Pillars Chip I/O Interconnections with Si MSM Photodetectors; IEEE Transactions on Electron Devices; vol. 51, No. 7; Jul. 2004; pp. 1084-1090.

W. Wayt Gibbs; Computing at the Speed of Light; Scientific American; Nov. 2004; pp. 81-87.

John Baliga; Polymer Pillars for Optical and Electrical Signals; Semiconductor International; Dec. 2004; p. 36.

Richard Ball; ISSCC: Polymer Pillars Used to Connect Die; Electronics Weekly Archive; Feb. 2003.

Ron Wilson; Session Examines Novel Semiconductor Devices; EE Times; Feb. 12, 2003; URL: http://eetimes.com/article/showArticle.jhtml?articleID=18308034.

* cited by examiner

MICROFLUIDIC, OPTICAL, AND ELECTRICAL INPUT OUTPUT INTERCONNECTS, METHODS OF FABRICATION THEREOF, AND METHODS OF USE THEREOF

CROSS-REFERENCE TO RELATED APPLICATION

This application claims priority to U.S. provisional application entitled, "Electrical, optical, microfluidic, I/O interconnections, methods of fabrication thereof, and methods of use thereof," having Ser. No. 60/628,406, filed on Nov. 16, 2004, which is entirely incorporated herein by reference.

TECHNICAL FIELD

The present disclosure is generally related to input/output interconnections and, more particularly, is related to optical, electrical, and fluidic interconnections, wafer-level batch fabrication, and wafer-level packaging.

BACKGROUND

As gigascale silicon technology approaches the 50 nm generation and beyond, the performance of a monolithic system-on-a-chip (SoC) has failed by progressively greater margins to reach the "intrinsic limits" of each particular generation of technology. The root cause of this failure is the fact that the capabilities of monolithic silicon technology per se have vastly surpassed those of the ancillary or supporting technologies that are essential to the full exploitation of a high performance SoC. The most serious obstacle that blocks fulfillment of the ultimate performance of a SoC is inferior heat removal. The increase in clock frequency of a SoC has been virtually brought to a halt by the lack of acceptable ways for removing, for example, 200 W from a 15×15 mm die. A huge deficit in chip input/output (I/O) bandwidth due to tack of I/O interconnect density is the second most serious deficiency stalling high performance gains. The excessive access time of a chip multiprocessor (CMP) for communication with its off-chip main memory is a direct consequence of the lack of, for example, a low latency 100 THz bandwidth I/O signal network. Lastly, SoC performance has been severely constrained by inadequate I/O interconnect technology capable of supplying, for example, 200–400 A at 0.5 V to a CMP.

Accordingly, there is a need in the industry to address the aforementioned deficiencies and/or inadequacies.

SUMMARY

Input/output (I/O) interconnects, fluidic I/O interconnects, electrical, optical, and fluidic I/O interconnects, devices incorporating one or more of the I/O interconnects, systems incorporating one or more of the I/O interconnects, and methods of fabricating one or more of the I/O interconnects, devices, and systems, are described herein.

An embodiment of an electrical, optical, and fluidic I/O interconnect system, among others, includes a first substrate comprising the following: a surface-normal waveguide interconnect extending from the first substrate, wherein the first substrate is adapted to communicate optical energy through the waveguide interconnect; a surface-normal electrical lead interconnect extending from the first substrate, wherein the first substrate is adapted to communicate electrical energy through the electrical lead interconnect; and a surface-normal fluidic micropipe interconnect surface-normally extending from the first substrate, wherein the micropipe interconnect is configured to transport a fluid, and wherein the first substrate is adapted to flow fluids through the fluidic micropipe interconnect.

An embodiment of a method for forming a device, among others, includes providing the first substrate as described above, providing the second substrate as described herein, causing the waveguide connector to receive a portion of the waveguide interconnect, causing the electrical lead connector to receive a portion of the electrical lead interconnect, and causing the fluidic connector to receive a portion of the fluidic micropipe interconnect.

An embodiment of a method for directing fluids, optical energy, and electrical energy, among others, includes, providing the first substrate as described above, providing the second substrate as described herein, communicating optical energy between the waveguide interconnect of the first substrate and the second substrate, communicating electrical energy between the electrical lead interconnect of the first substrate and the second substrate, and transporting a fluid between the first substrate and the second substrate through the fluidic micropipe interconnect.

An embodiment of a fluidic I/O interconnect, among others, includes: a first substrate comprising a surface-normal fluidic micropipe interconnect, wherein the fluidic micropipe interconnect is configured to transport a fluid, wherein the first substrate is incorporated into a structure selected from one of the following: microprocessor, microelectronic chip, Application Specific Integrated Circuit (ASICs) chip, System-on-a-Chip (SoC) architecture chip, optoelectronic chip, hybrid optoelectronic/microelectronic chip, bioengineering, and combinations thereof.

An embodiment of an I/O interconnect, among others, includes: a first substrate comprising a compliant pillar surface-normally extending from the first substrate, wherein the compliant pillar has a length of about 5 to 500 micrometers and a width of about 2 to 5000 micrometers, wherein the compliant pillar has a metal layer disposed on a portion of the compliant pillar, wherein the metal layer has a thickness of about 0.1 to 100 micrometers, and wherein the compliant pillar is a polymer material selected from one of the following: polyimides, epoxides, polynorbornenes, polyarylene ethers, and parylenes.

An embodiment of an I/O interconnect, among others, includes a first substrate comprising a metal interconnect pad and a first optical component, wherein the metal interconnect pad is positioned over the first optical component, wherein the metal interconnect pad has an opening through the metal interconnect pad, and wherein the opening in the metal interconnect pad exposes the first optical component.

Other systems, methods, features, and advantages of the present disclosure will be, or become, apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosed devices and methods can be better understood with reference to the following drawings. The components in the drawings are not necessarily to scale, emphasis instead being placed upon clearly illustrating the relevant principles. Moreover, in the drawings, like reference numerals designate corresponding parts throughout the several views.

DETAILED DESCRIPTION

Figure 1A:
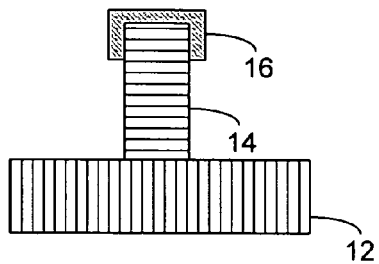
FIGS. 1A through 1C illustrate embodiments of a pillar having a metal cap disposed thereon.

Input/output (I/O) interconnects, fluidic I/O interconnects, electrical, optical, and fluidic I/O interconnects, devices incorporating the I/O interconnects, systems incorporating the I/O interconnects, and methods of fabricating the I/O interconnects, devices, and systems, are described herein.

The types of devices that can include and use the I/O interconnects and systems described herein include, but are not limited to, high speed and high performance chips such as, but not limited to, microprocessors, communication chips, and optoelectronic chips. For example, each of the I/O interconnects can be used in high-performance or cost-performance microprocessors, Application Specific Integrated Circuits (ASICs), System-on-a-Chip (SoC) architectures based chips, optoelectronic chips, or hybrid optoelectronic/microelectronic chips. In addition, each of the I/O interconnects can also be used in bioengineering, chemical sensing, and similar technologies.

For optical interconnection, alignment should be maintained between the optical devices on the board and the chip during field service. As a result, it is important to mitigate the offset that may be introduced by thermal expansion mismatches between the chip and the board. This problem can, at least in part, be solved with a mechanically flexible (compliant) optical waveguide pillar that is substantially perpendicular to the chip on which it is disposed. This mitigates optical losses due to offset. In addition, the optical waveguide pillars prevent light spreading as it is routed between two parallel surfaces, such as chip and a board.

Dual optical/electrical I/O interconnects allow for a single pillar to be used as a platform to communicate both optical energy (pillar waveguide) and electrical energy (electrical lead) energy or radio frequency (RF) energy (RF lead). The optical/electrical I/O interconnect can guide optical energy from a first substrate to a second substrate positioned substantially horizontal (e.g., substantially in the same plane as) to the first substrate, while also connecting an electrical signal via the lead from the first substrate to the second substrate. In one embodiment, the tip of the pillar can be a non-flat (e.g., slanted) surface, and the metal from the lead can be disposed over the slanted portion of the tip. In this manner, the metal can be used as a mirror to direct the optical energy. In another embodiment, an element (e.g., grating coupler or mirror) can be used at the tip of the pillar to guide the optical energy. In still another embodiment, a mirror or grating coupler can be used on the second substrate to guide the optical energy out of the pillar.

Dual optical/electrical I/O interconnects are advantageous for at least the following reasons: 1) the same space is being used for electrical/optical I/O, and thus, there is a very high density of interconnections, 2) there is very high interconnect process integration between the two, 3) they can be made compliant, 4) they maintain alignment, 5) they can be wafer-level batch fabricated, and 6) the sockets aid in attachment.

In addition, the use of these components enables ultra high I/O density (e.g., about 10 to about 500,000 or more components per centimeter squared ($cm^2$)) to be achieved on the chip at wafer-level and printed board, which can enhance power distribution, increase I/O bandwidth, satisfy three-dimensional structural I/O demands, suppress simultaneous switching noise, improve isolation in mixed signal systems, and decrease costs. In addition, wafer-level functionality testing, or wafer sort, which is used to identify good die from bad, can be enhanced (e.g., reduced time and cost). Furthermore, for optical, electrical, and RF interconnections, high density I/Os enable massive chip to board bandwidth.

Patterned Pillar Interconnects

FIGS. 1A through 4B illustrate a number of embodiments of surface-normal pillars having metal caps, metal rings, and completely metallized sidewalls. In general, a metal ring, metal cap, or a complete metal sidewall can be fabricated on a portion of a pillar (e.g., a polymer pillar). In an embodiment, the pillar is a surface-normal optical waveguide (transverse to the substrate). While only "solid core" pillars are shown, these configurations apply to pillars with a hollow core as well (e.g., a micropipe).

While it is possible to use an adhesive to bond the pillar to a substrate (e.g., a board), it is possible to fabricate a thin and narrow metallic layer around a portion of the pillar such that electrical solder can be used to hold the pillar. Thus, using the pillars does create a presumption that separate materials (an optical adhesive) are needed to mechanically hold the pillar. In addition, the intrinsic air-cladding of the pillars is preserved resulting in a large index of refraction difference between the pillar (e.g., waveguide core) and the cladding. Using pillars simplifies the processing required on the board.

In an embodiment not shown, a dielectric material may separate the metal layer and the pillar. Functions of the metal layer can include, but are not limited to, assembly advantages, mechanical connection between chip and board, simultaneous electrical and optical interconnection, and combinations thereof.

Figure 1B:
Figure 1C:
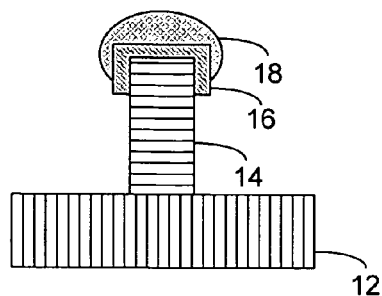

FIGS. 1A through 1C illustrate embodiments of a pillar having a metal cap disposed thereon. FIG. 1A illustrates a surface-normal pillar 14 disposed on a substrate 12 (e.g., the pillar 14 is transverse to the substrate 12, and the length of the pillar 14 extends substantially perpendicular from the substrate 12). The pillar 14 has a metal cap 16 disposed on a portion of the tip of the pillar 14 opposite the substrate 12. The metal cap 16 can be formed on a portion of the top of the pillar 14. In embodiments not shown, the metal cap 16 can be formed on portions of the pillar 14 down to the substrate 12 or on the entire pillar 14 down to the substrate 12. FIG. 1B is an illustration of an actual metal cap on a pillar. FIG. 1C illustrates a solder material 18 disposed on the metal cap 16. The solder material 18 can be used to bond to another substrate. Functions of the metal cap 16 can include, but are not limited to, providing mechanical connection between chip and board, and combinations thereof.

Figure 2A:
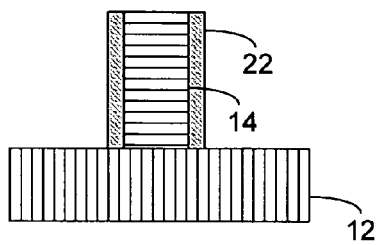
FIGS. 2A through 2C illustrate embodiments of a pillar having a metal layer disposed on portions of the sidewalls of the pillar.
Figure 2B:
Figure 2C:
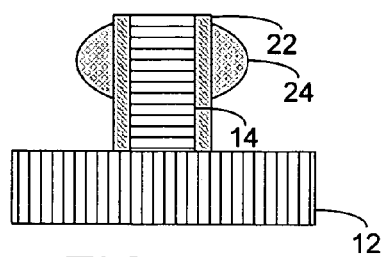

FIGS. 2A through 2C illustrate embodiments of a pillar 14 having a metal layer 22 disposed on portions of the sidewalls of the pillar 14. FIG. 2A illustrates a pillar 14 having a metal layer 22 disposed on the sidewalls of the pillar 14 from the top of the pillar 14 to a substrate 12 on which the pillar 14 is formed.

It should be noted that the metal layer 22 could be electrically conductive. In an embodiment, the pillar 14 (e.g., a surface-normal waveguide) and metal layer 22 can be used as a dual optical/electrical I/o interconnection to provide simultaneous electrical and optical interconnection.

FIG. 2B is an illustration of actual pillars having a metal layer disposed on the sidewalls of the pillar. FIG. 2C illustrates a solder material 24 disposed on the metal layer 22. The solder material 24 can be used to bond to another substrate and/or provide an electrical connection.

Figure 3A:
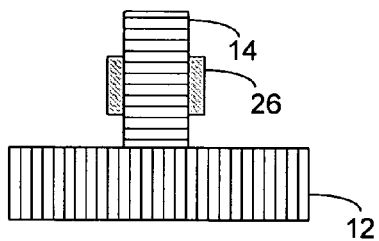
FIGS. 3A through 3C illustrate embodiments of a pillar having a metal layer (metal ring) disposed on middle portions of the sidewalls of the pillar.
Figure 3B:
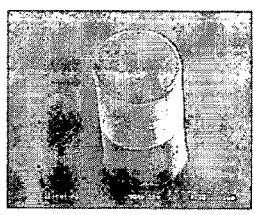
Figure 3C:
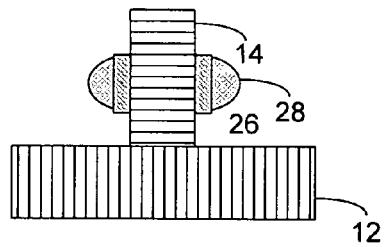

FIGS. 3A through 3C illustrate embodiments of a pillar 14 having a metal layer 26 (metal ring) disposed on middle portions of the sidewalls of the pillar 14. FIG. 3A illustrates a metal layer 26 disposed on a middle portion of the sidewall of the pillar 14. The pillar 14 is disposed on a substrate 12. FIG. 3B is an illustration of an actual metal ring around a pillar. FIG. 3C illustrates a solder material 28 disposed on the metal layer 26. The solder material 28 can bond to anther substrate, where the pillar 14 enters a cavity of the other substrate. For example, if the pillar 14 is a surface-normal optical waveguide, the optical component of the other substrate may be disposed within the other substrate. Therefore, the solder material 28 can bond to the surface of the other substrate and not interfere with the transmission of the optical signal. It should be noted that the metal layer ring can be fabricated anywhere along the length of the pillar.

Figure 4A:
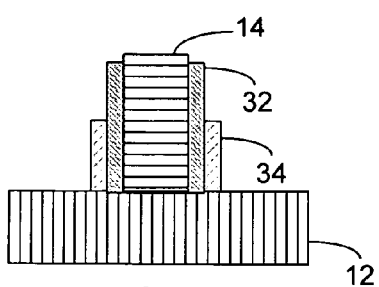
FIGS. 4A and 4B illustrate embodiments of a pillar having a metal layer (metal ring) disposed on portions of the sidewalls of the pillar.
Figure 4B:
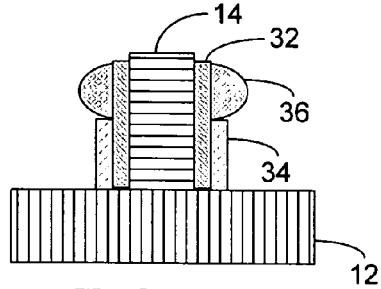

FIGS. 4A and 4B illustrate embodiments of a pillar 14 having a metal layer 32 (metal ring) disposed on portions of the sidewalls of the pillar 14. FIG. 4A illustrates the pillar 14 disposed on a substrate 12 having a metal layer 32 disposed on a top portion of the pillar 14 and a blocking layer 34 disposed on a portion of the pillar 14 adjacent the metal layer 32. FIG. 4B illustrates a solder material 36 disposed on the metal layer 32 and adjacent the blocking layer 34. The blocking layer 34 has a diameter greater than that of the metal layer 32 so that the solder material 36 does not flow off of the metal layer 32.

The substrate 12 can include, but is not limited to, electronic and optoelectronic chips as well as a printed wiring board, a printed wiring/waveguide board, and appropriate mating substrates. The substrate 12 can include additional components such as, but not limited to, fluidic channels, a fluidic architecture, die pads, leads, input/output components, waveguides (e.g., optical and RF), air gaps, planar waveguides, polymer waveguides, optical waveguides having optical coupling elements such as diffractive grating couplers and mirrors disposed adjacent or within the optical waveguide, photodetectors, and optical sources such as VCSELS and LEDs, and any combination thereof.

The pillar 14 can be fabricated of one or more materials that enhance compliance in-plane and out-of-plane (i.e., x-, y-axis and z-axis directions, respectively). The fabrication of the pillar 14 with this material allows the components to be compliant in the x-, y- and/or z directions, which allows the components to be attached to a chip and/or printed board with a higher coefficient of thermal expansion without underfill, thus lowering costs and enhancing reliability. In addition, forming the pillar 14 enhances compliance in the z-axis direction.

In general, materials that can serve as the pillar 14 material are materials that exhibit one or more of the following: (a) process compatibility with standard microelectronic fabrication processes, (b) suitable mechanical strength, flexibility, and durability, (c) sufficient lifetime and/or reliability characteristics, (d) low loss, and (e) photodefinability. In another embodiment, the pillar material may not exhibit the previous characteristics, but could still be used as a pillar material.

In another embodiment, the pillar material may have optical characteristics to guide optical energy such as transparency to a particular optical wavelength of light and/or process compatibility with other materials such that a contrast in refractive index is achieved. A reference describing polymer materials suitable for optical waveguide applications can be found in A. R. Blythe and J. R. Vinson, Proc. 5$^{th}$ *International Symposium on Polymers for Advanced Technologies,* Tokyo, Japan: pp. 601–11, August-December 2000, which is incorporated herein by reference.

In particular, the pillar 14 can be made of a low modulus material such as, but not limited to, polyimides, epoxides, polynorbornenes, polyarylene ethers, and parylenes. In particular, the low modulus materials can include, but are not limited to, compounds such as Amoco Ultradel™ 7501, Promerus LLC's, Avatrel™ Dielectric Polymer, DuPont™ 2611, DuPont 2734, DuPont 2771, DuPont 2555, and MicroChem SU-8. The pillar 14 can be fabricated by photodefinition and additional processes using the polymer material Avatrel 2000P from Promerus, LLC, or the like, which has shown high optical quality and high compliance.

Furthermore, the pillar 14 can be fabricated to have varying indices of refraction within different regions. For example, if a polymer pillar is 150 μm tall, the 50 μm closest to the first substrate 12 can have a first index of refraction, the next 50 μm can have a second index of refraction, and the last 50 μm (the end opposite the first substrate 12) can have a third index of refraction. In addition, the pillars may also be fabricated such that they have negative or positive sloped sidewalls and/or the sidewalls are slanted to the surface of the substrate (off-normal).

In another embodiment, the pillar 14 functions as a medium through which optical energy travels. As such, the pillar 14 can communicate optical energy from one substrate or device to another substrate or device using one or more waveguides that may include one or more coupling elements and/or one or more mirrors. The waveguides, coupling elements, and/or the mirrors can be included within and/or disposed upon the substrates 12 and/or the pillar 14.

The coupling element can include mirrors, planar (or volume) grating couplers, evanescent couplers, surface-relief grating couplers, and total internal reflection couplers, for example. More specifically, when the coupling element is a volume grating coupler, the coupling material can be laminated or spin-coated onto the appropriate surface. In particular, a laminated volume grating coupler can be formed by holographic exposure of the grating region following lamination of the grating material. Alternatively, the laminated volume grating coupler can be formed by holographic exposure prior to lamination of the grating material. In the case where the coupling element is to be formed inside of the compliant pillar waveguide, the compliant pillar waveguide and coupler can be composed of separate materials. Additional details regarding grating couplers can be found in U.S. Pat. No. 6,285,813, which is incorporated herein by reference.

If the coupling element is a grating coupler, then the grating coupler material includes materials such as, for example, polymer materials, silver halide photographic emulsions, photoresists such as dichromated gelatin, photopolymers such as polymethyl methacrylate (PMMA) or Dupont HRF photopolymer films such as, for example, thermoplastic materials, photochromic materials such as crystals, glasses or organic substrates, photodichroic materials, and photorefractive crystals such as for example, lithium niobate. These materials have the characteristics of creating a refractive index modulation through a variety of mechanisms, all of which result in the creation of a phase, absorption, or mixed grating. Other suitable materials are described in T. K. Gaylord and M. G. Moharam, *Proc. IEEE*, vol. 73, pp. 894–937, May 1985, which is herein incorporated by reference. Preferably, the fabrication of a grating coupler is done on the pillar, and thus at the wafer-level, where nano-lithography is readily available. To fabricate such a device on the printed wiring/waveguide board would potentially be expensive.

The cross sections of the pillars 14 are not limited to the lateral circular cross section. In addition, the pillar 14 can have a cross section such as, but not limited to, a polygonal cross section, a circular cross section, and an elliptical cross section.

In addition, the pillar 14 can have a non-flat tip and can have various topographies such as, but not limited to, a rounded, pointed, or squared off portion of the tip. In addition, the non-flat tip can be partially slanted, have teeth cut on a portion of the tip, or be concave. In general, the various types of tip topography can facilitate two different functions. A tip topography may enhance and/or assistant in making a better mechanical interconnection between the socket and the pillar. In addition, a tip topography can be used for optical interconnection purposes. As such, the relative scale of the tip topography for each function can vary significantly and the tip topography can be designed accordingly.

The pillar 14 can have a height from about 5 to about 500 micrometers, a width of about 2 to about 5000 micrometers, and a length of about 2 to about 5000 micrometers. Preferably, the pillar 14 can have a height from about 15 to about 150 micrometers, a width of about 5 to about 50 micrometers, and a length of about 5 to about 50 micrometers.

In addition, the compliance of the pillar 14 is a function of the cure temperature (e.g., about 180 to 200° C.) and time duration (e.g., about 1 to 4 hours) of the cure temperature. Therefore, the value of compliance can be controlled by the cure conditions. In general, "stiff" compliant pillars can be fabricated under high cure temperature over long cure time conditions, while "soft" compliant pillars can be fabricated under low cure temperature over short (or no) cure time conditions.

The metal of the metal layers 16, 22, 26, and 32 can include, but is not limited to, copper, gold, nickel, solder (e.g., leaded and lead free solder), chrome, aluminum, alloys thereof, and combinations thereof. As mentioned, the metal can cover a portion (in the direction extending from the substrate surface) of the sidewall of the pillar 14. In addition, the metal can cover a portion of the pillar 14 and can cover or leave open a portion of the top of the pillar 14 (e.g., the entire top or a designated portion is open), depending on the intended use of the pillar 14 and metal layers 16, 22, 26, and 32. Further, the metal can cover the complete sidewall of the pillar. In addition, the complete metal sidewall can cover the top of the pillar (e.g., the entire top or a designated portion is open).

In other embodiments, the metal can cover less than the circumference of the pillar (e.g., a partial metal ring, partial metal cap, and a partial metal sidewall). In addition, the metal may also be fabricated as unconnected metal wires along the length of the pillar. This minimizes the effects of metal on the compliance of the pillar.

The metal layers 16, 22, 26, and 32 can have a thickness of about 0.1 μm to 100 μm, 1 μm to 100 μm, 10 μm to 100 μm, 1 μm to 50 μm, 10 μm to 50 μm, 50 μm to 100 μm, and 10 μm to 75 μm. The height (from the bottom of the pillar to the top of the pillar) of the metal layers 16, 22, 26, and 32 can be selected depending on the intended function. In addition, the height depends, in part, on the height of the pillar 14. In general, the radius of the metal layers 16, 22, 26, and 32 depends on the radius of the pillar 14.

The type, size, and shape of the pillar 14, the metal of the metal layers 16, 22, 26, and 32, and the dimensions of the metal layers 16, 22, 26, and 32, determine the compliancy of the pillar 14. Therefore, selecting the type, size, and shape of the pillar can, in part, control the amount of compliance.

The solder material 18, 24, 28, and 36, can include, but is not limited to, lead and lead-free solder such as tin-lead and tin-copper-silver alloy solders. In addition, conductive adhesives can also be used as the solder material. The amount of solder material 18, 24, 28, and 36 used depends, at least in part, on the size of the pillar 14 and metal layers 16, 22, 26, and 32, and the application that the structure is used in.

The blocking layer 34 can include materials such as, but not limited to, polymers (similar to those described in reference to the pillar), silicon dioxide, and combinations thereof. The height of the blocking layer 34 depends, at least in part, on the height of the pillar 14 and the position of the metal layer 32. The thickness of the blocking layer 34 depends in part on the thickness of the metal layer 32, but the blocking layer 34 is thicker than the metal layer 32 in embodiments where the blocking layer 34 is substantially preventing or preventing the solder material 36 from flowing off of the metal layer 32. In another embodiment, the blocking layer 34 is tapered at the top of the blocking layer towards the metal layer 32 to prevent solder material from flowing over the sides of the blocking layer 34.

For the purposes of illustration only, and without limitation, embodiments of the present disclosure will be described with particular reference to the below-described fabrication methods. Note that not every step in the process is described with reference to the process illustrated in the figures hereinafter. Therefore, the following fabrication processes are not intended to be an exhaustive list that includes every step required to fabricate the embodiments of the illustrated components. In addition, the steps of the process can be performed in a different order to accomplish the same result.

Figure 5A:
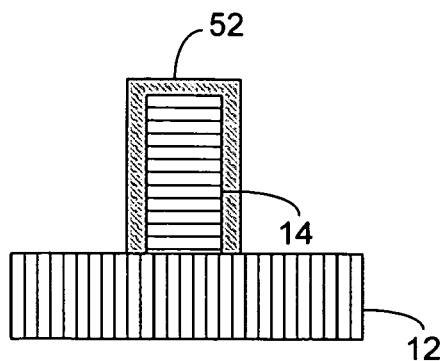
FIGS. 5A through 5I illustrate a representative embodiment of a method for fabricating the metal capped pillar of FIG. 1A.

FIGS. 5A through 5I illustrate a representative embodiment of a method for fabricating the metal capped pillar of FIG. 1A. FIG. 5A illustrates a pillar 14 disposed on a substrate 12. The pillar 14 has a metal layer 52 disposed on the surface of the pillar 14. The metal layer 52 can be disposed on the pillar using techniques such as, but not limited to, photo-definition, wet chemical etching, and dry plasma etching.

Figure 5B:
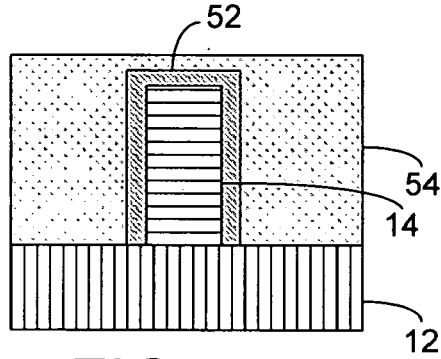

FIG. 5B illustrates a polymer layer 54 disposed on the pillar 14, metal layer 52, and the substrate 12. The polymer layer 54 can include materials such as, but not limited to, polyimides, polynorbornenes, epoxides, polyarylenes, ethers, polyarylene ethers, parylenes, inorganic glasses, and combinations thereof. More specifically the polymer layer 54 includes compounds such as Amoco Ultradel™ 7501, BF Goodrich Avatrel™ Dielectric Polymer, DuPont 2611, DuPont 2734, DuPont 2771, DuPont 2555, silicon dioxide, silicon nitride, and aluminum oxide. The polymer layer 54 can be deposited onto the substrate 12 using techniques such as, for example, spin coating, doctor-blading, sputtering, lamination, screen or stencil-printing, chemical vapor deposition (CVD), and plasma based deposition systems.

Figure 5C:
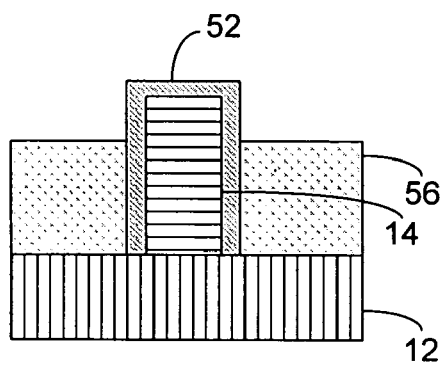

FIG. 5C illustrates the removal of a portion of the polymer layer 54 to form a polymer layer 56 that exposes a portion of the pillar 14 and metal layer 52. The polymer layer 54 can be removed using techniques such as, but not limited to, photo-definition, wet chemical etching, dry plasma etching, thermally-induced refractive index gradients, ion implantation, and combinations thereof.

Figure 5D:
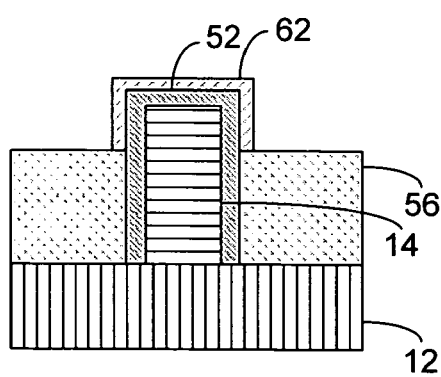

FIG. 5D illustrates the formation of a layer 62 on the exposed portion of the metal layer 52. The layer 62 can be made of materials such as, but not limited to, silicon dioxide, and other similar materials. This layer is used as an etch mask layer. The layer 62 can be formed using techniques such as, but not limited to, photo-definition, wet chemical etching, dry plasma etching, thermally-induced refractive index gradients, ion implantation, and combinations thereof. The layer 62 can have a thickness of about 0.1 µm to 5 µm.

Figure 5E:
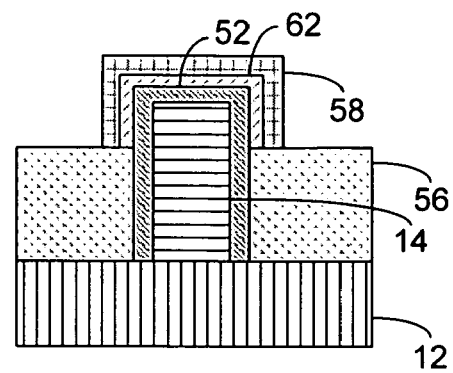

FIG. 5E illustrates the formation of a pattern of a resist 58 on the layer 62. The resist 58 can include materials that are commercially available. The resist can be formed using techniques such as, but not limited to, photo-definition, wet chemical etching, dry plasma etching, thermally-induced refractive index gradients, and ion implantation.

Figure 5F:
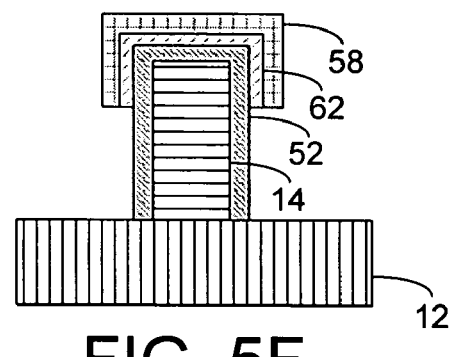
Figure 5G:
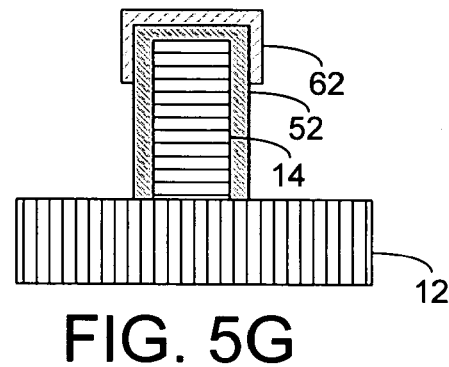

FIG. 5F illustrates the removal of the polymer layer 56. The polymer layer 56 can be removed using techniques such as, but not limited to, photo-definition, wet chemical etching, dry plasma etching, thermally-induced refractive index gradients, ion implantation, and combinations thereof. FIG. 5G illustrates the removal of the resist 58. The resist 58 can be removed using techniques such as, but not limited to, photo-definition, wet chemical etching, dry plasma etching, thermally-induced refractive index gradients, and ion implantation.

Figure 5H:
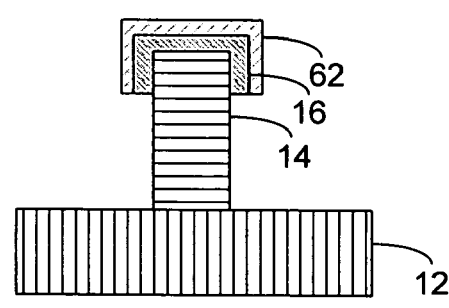

FIG. 5H illustrates the removal of the exposed metal layer 52 to expose the pillar 14. The remaining metal layer is a metal cap 16 on the tip of the pillar 14. The metal layer 52 can be removed using techniques such as, but not limited to, photo-definition, wet chemical etching, dry plasma etching, thermally-induced refractive index gradients, and ion implantation.

Figure 5I:
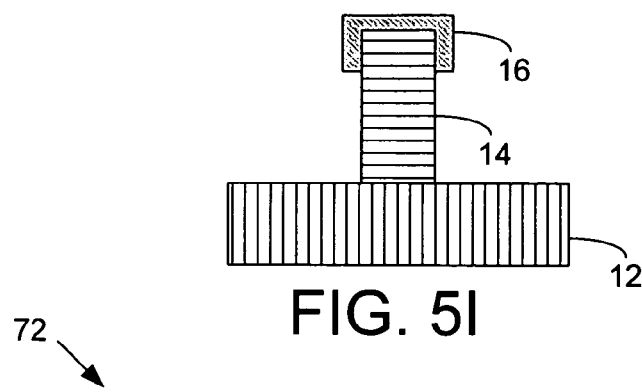

FIG. 5I illustrates the removal of the layer 62. The layer 62 can be removed using techniques such as, but not limited to, photo-definition, wet chemical etching, dry plasma etching, thermally-induced refractive index gradients, and ion implantation. It should also be noted a metal layer ring could be formed by removing the top portion of the metal layer 52.

Fluidic Micropipe Interconnects

Fluidic micropipe interconnects can be used in systems and devices to remove heat using a flowing fluid (e.g., a liquid, gas, supercritical fluid, or the like). The Fluidic micropipe interconnects can be part of a fluidic architecture used to remove thermal energy form devices and systems as described herein. The fluidic architecture can run through multiple substrates that are initially separate structures. For example, a fluidic micropipe interconnect is in fluid communication with micropipes within one or more substrates. The fluid can flow through and/or between the substrates through the micropipes and one or more fluidic micropipe interconnects. It should also be noted that the fluid can include, but is not limited to, biological agent, chemical agents, organic fluids, and the like.

Figure 6A:
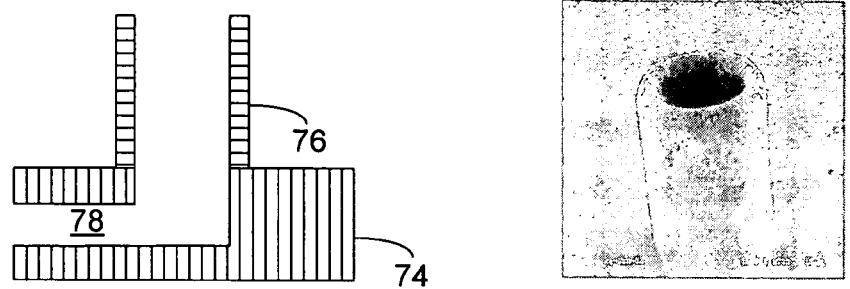
FIGS. 6A and 6B illustrate an embodiment of a micropipe.
Figure 6B:
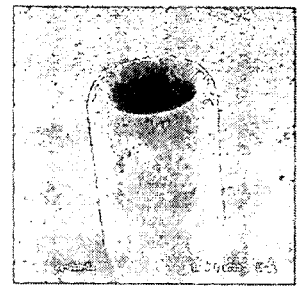

FIGS. 6A and 6B illustrate an embodiment of a therofluidic micropipe 72. The fluidic micropipe 72 includes micropipe walls 76 disposed on a substrate 74 having micropipes 78. FIG. 6B illustrates an actual fluidic micropipe 72. The substrate 74 is similar to the substrates 12 described above with the addition of the micropipes 78. The micropipe walls 76 can be formed of one or more materials, such as, polymers, metals, and combinations thereof. The polymers include, but are not limited to, the polymers mentioned herein in regard to the pillars 14. The metals can include, but are not limited to, copper, gold, nickel, titanium, and combinations thereof. The micropipe walls 76 can have a thickness of about 2 to 500 µm. The micropipe walls 76 can have a height of about 2 to 500 µm. The micropipe 72 can have a diameter of about 2 to 5000 µm.

Figure 7:
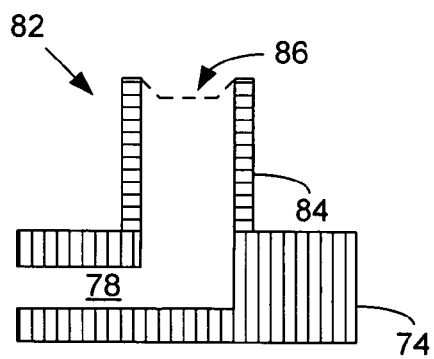
FIG. 7 illustrates another embodiment of a micropipe having a non-flat tip.

FIG. 7 illustrates another embodiment of a fluidic micropipe 82 having a non-flat tip. The fluidic micropipe 82 is disposed on a substrate 74. The fluidic micropipe 82 includes micropipe walls 84, where the height of the micropipe walls 84 are not equivalent at all points around the top. The non-flat tip of the microfluidic micropipe 82 can be used to properly flow fluid thought the micropipes 78. The dimensions of the microfluidic micropipe 82 and micropipe walls 84 are similar to those described in reference to FIG. 6A.

Figure 8A:
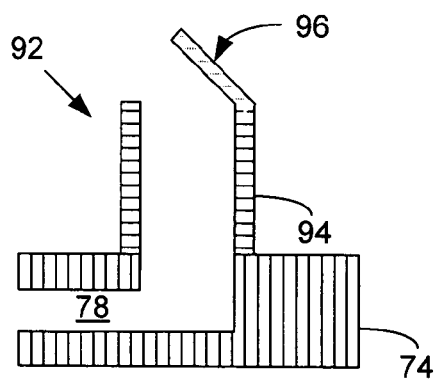
FIGS. 8A and 8B illustrate a micropipe having a reflector.
Figure 8B:
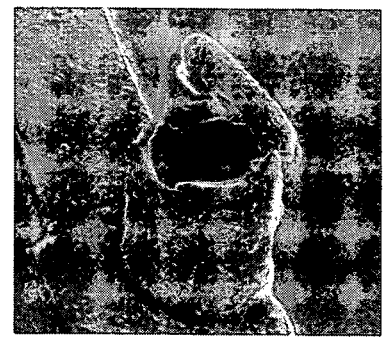

FIGS. 8A and 8B illustrate a microfluidic micropipe 92 having a reflector 96. The microfluidic micropipe 92 is disposed on a substrate 74. The microfluidic micropipe 92 has micropipe walls 94 and the reflector 96. The reflector 96 assists in guiding the fluid in the appropriate direction. For example, in an embodiment where the microfluidic micropipe 92 inserts into another receiving substrate, the reflector 96 can be used to guide the fluid in a particular direction or prevent the fluid from flowing in a particular direction. The reflector 96 may have many configurations, for example, the reflector 96 may be slanted as shown in FIG. 8A and then become horizontal.

Figure 9:
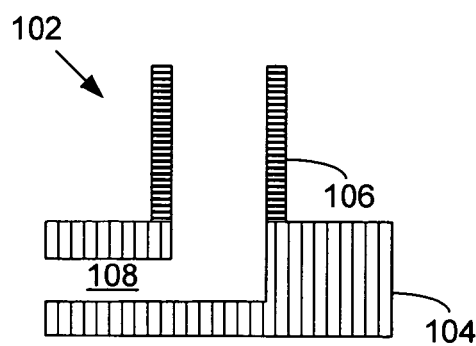
FIG. 9 illustrates a micropipe having metal micropipe walls

FIG. 9 illustrates a microfluidic micropipe 102 having metal micropipe walls 106. The microfluidic micropipe 102 includes metal micropipe walls 106 disposed on a substrate 104, where the substrate is similar to substrate 12 described herein. The metal micropipe walls 106 are in fluid communication with micropipes 108 within the substrate 104. The micropipe 108 is a planar microfluidic channel disposed within the substrate.

For the purposes of illustration only, and without limitation, embodiments of the present disclosure will be described with particular reference to the below-described fabrication methods. Note that not every step in the process is described with reference to the process illustrated in the figures hereinafter. Therefore, the following fabrication processes are not intended to be an exhaustive list that includes every step required to fabricate the embodiments of the illustrated components. In addition, the steps of the process can be performed in a different order to accomplish the same result.

Figure 10A:
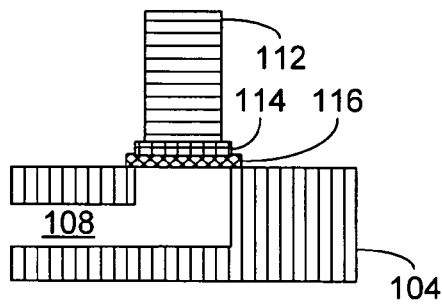
FIGS. 10A through 10E illustrate a substrate (similar to other substrates described herein) having a micropipe therein.

FIGS. 10A through 10E depict an illustrative method of forming a therofluidic micropipe. FIG. 10A illustrates a substrate 104 (similar to other substrates described herein) having a micropipe 108 therein. A protective layer 116 is disposed over an opening of the micropipe 108. A sacrificial layer 114 is disposed on a portion of the protective layer 116. A pillar is disposed on the sacrificial layer 114. The pillar can have dimensions similar to the other pillars 14 described herein. The protective layer 116 can include materials such as, but not limited to, silicon dioxide, nitrides, and polymers (as described herein in regard to the pillars 14). The protective layer 116 can have a thickness of about 0.1 µm to 5 µm. The sacrificial layer 114 can include materials such as, but not limited to, thermally decomposable polymer, metals, and inorganic dielectrics. The sacrificial layer 114 can have a thickness of about 0.1 to 5 µm. The pillar can be made of materials such as those described above for pillars (e.g., pillar 14).

Figure 10B:
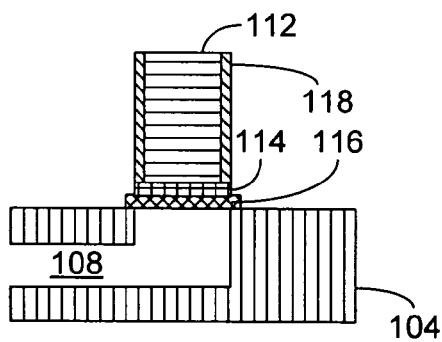
Figure 10C:
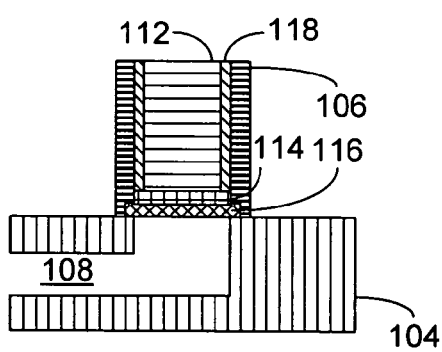

FIG. 10B illustrates the formation of a sacrificial layer 118 on the sidewalls of the pillar 112. The sacrificial material 118 can include materials such as, but not limited to, thermally decomposable polymer, silicon dioxide, and metals (as described herein). The sacrificial material 118 can be formed using techniques such as, but not limited to, PECVD, PVD, evaporation, and the like. FIG. 10C illustrates the formation of a metal layer 106 (micropipe wall 106) on the pillar 112 and sacrificial layer 118. The metal layer 106 can be formed using techniques such as, but not limited to, photo-definition, wet chemical etching, dry plasma etching, thermally-induced refractive index gradients, ion implantation, and combinations thereof. The metal of the metal layer 106 can include metals such as those described above for microfluidic micropipes.

Figure 10D:
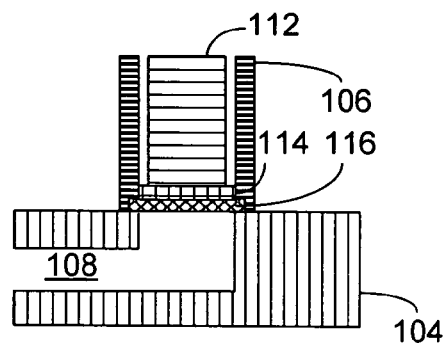
Figure 10E:
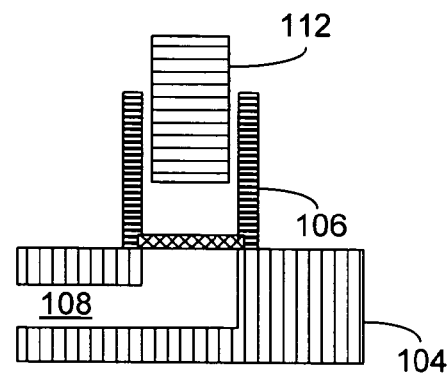

FIG. 10D illustrates the removal of the sacrificial layer 118 using techniques such as, but not limited to, photo-definition, wet chemical etching, dry plasma etching, thermally-induced refractive index gradients, ion implantation, and combinations thereof. FIG. 10E illustrates the removal of the sacrificial layer 114 using techniques such as, but not limited to, photo-definition, wet chemical etching, dry plasma etching, thermally-induced refractive index gradients, ion implantation, and combinations thereof. The removal of each of the sacrificial layers 114 and 118 allow the pillar 112 to be removed. It should be noted that the sacrificial layers 114 and 118 could be removed in a single step. It should also be noted that the protective layer 116 could be removed at some time prior to use of the micropipe 108 and fluidic micropipe 102.

It should also be noted that other methods for forming fluidic micropipes can be used, and appropriate modifications could be made depending on the materials used to form the fluidic micropipes. For example, the method described above can be modified to use micropipe walls made of polymers, polymers and a dielectric layer disposed on the sidewalls of the pillar, or polymer layers and metal layers.

An alternate method involves making the sidewall metallized pillars and thermally decomposing the polymer to leave behind the hollow core metal pipe. Localized heating can also be used so that only selected pillars are decomposed.

Electrical Interconnect, Optical Interconnect, and Fluidic Micropipe Interconnect, Systems Electrical, optical and fluidic micropipe I/O interconnects may enable a SoC to be constrained by the intrinsic limits of a particular generation of technology and not by ancillary or supporting technologies. In particular, electrical I/O interconnects provide chip DC power, the optical and electrical I/O interconnects address off-chip signaling, and the fluidic I/O interconnects facilitate heat removal.

The fluidic cooling eliminates the need for thermal interface materials (TIM) and massive heat sinks and will yield a chip-scale cooling technology. In this regard, the fluidic channels (micropipes) within a substrate can be included in the front and/or back side of the chip, and the fluidic I/O interconnects can be interfaced with the fluidic channels. The optical I/O interconnects minimize optical losses due to mechanical misalignment induced by chip-substrate coefficient of thermal expansion (CTE) mismatch and simplify optical alignment during assembly, which can account for a large fraction of the total cost in some applications. Another advantage of the electrical, optical and fluidic micropipe I/O interconnects is that they can use solder (or Cu—Cu bonding) and standard flip-chip bonders during assembly. In addition, the electrical, optical and fluidic micropipe I/O interconnects are compatible with 2D chips and 3D chip stacks.

Figure 11A:
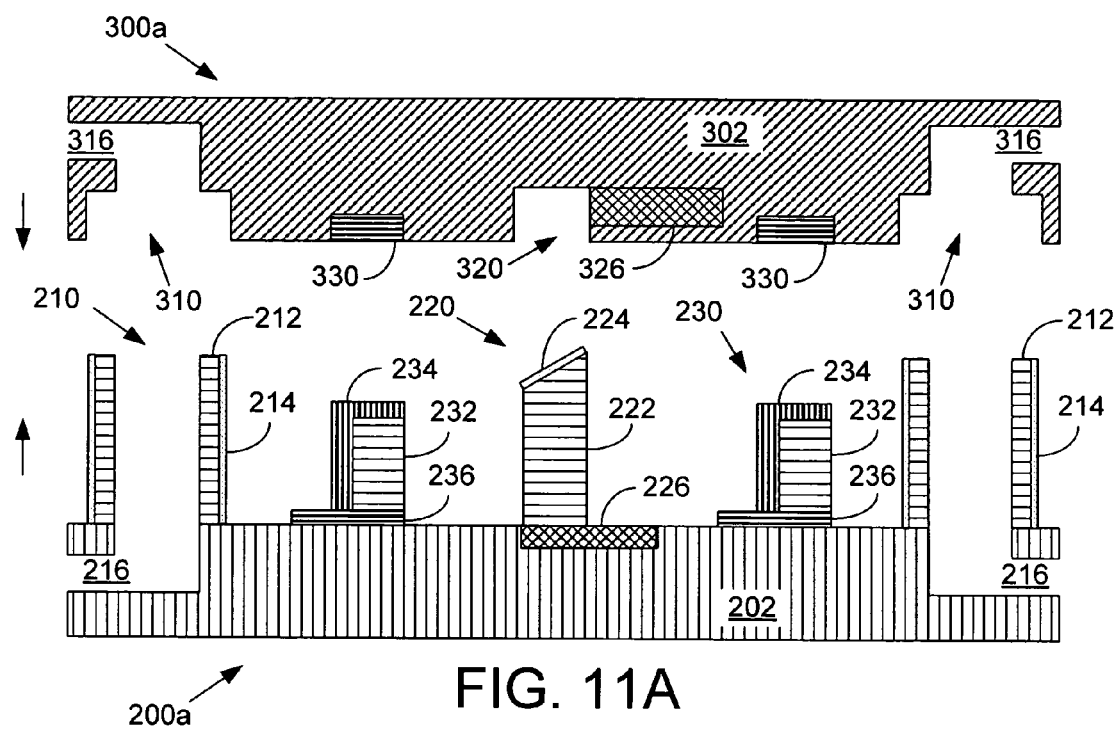
FIGS. 11A and 11B illustrate a system including electrical, optical and microfluidic I/O interconnects.
Figure 11B:
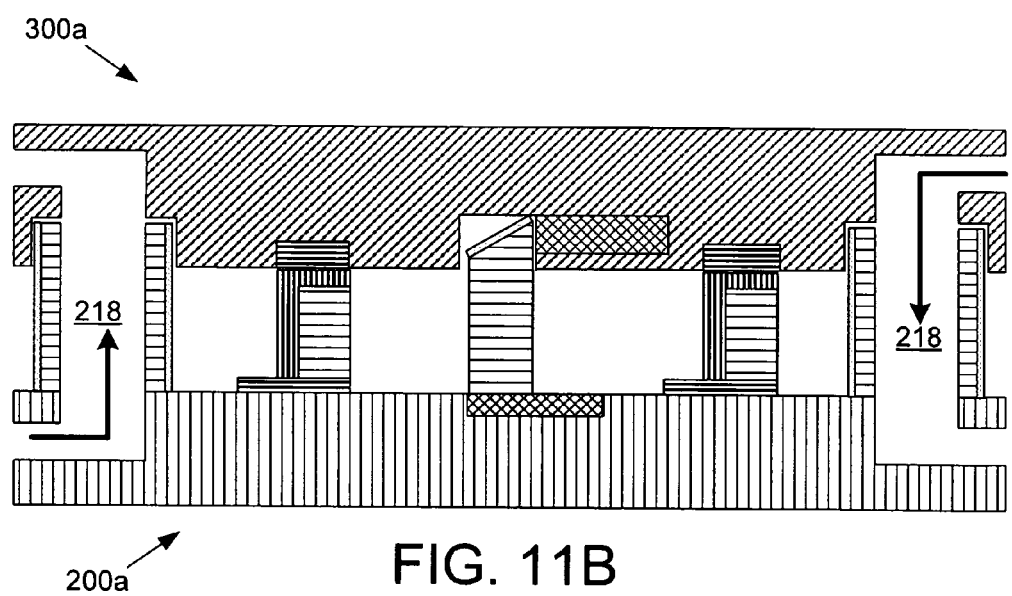

FIGS. 11A and 11B illustrate a system (e.g., a first structure 200a and a second structure 300a) including electrical, optical, and fluidic micropipe I/O interconnects. FIG. 11A illustrates the system prior to bonding, while FIG. 11B illustrates the system after bonding with a fluid 218 flowing through portions thereof. It should be noted that the figures do not show the bonding material between the various I/O interconnects and the second substrate 300a. It should be noted that both conductive and nonconductive materials can be used to bond the two substrates.

FIG. 11A illustrates a first structure 200a that includes a first substrate 202. The first structure 200a includes, but is not limited to, a fluidic micropipe interconnect 210, a surface-normal waveguide interconnect 220, and an electrical lead interconnect 230, disposed on the substrate 202. Each of the fluidic micropipe interconnect 210, the surface-normal waveguide interconnect 220, and the electrical lead interconnect 230, are surface-normal to the substrate 202. In an embodiment, one or more of the fluidic micropipe interconnect 210, the surface-normal waveguide interconnect 220, and the electrical lead interconnect 230, are substantially perpendicular to the surface of the substrate 202. The substrate 202 is similar to the substrates (e.g., substrate 12) described herein. It should be noted that the waveguide interconnect 220 and the electrical lead interconnect 230 may have different heights. By having different heights, the waveguide interconnect 220 can be longer to extend and enter a portion of the second structure 300a. It should be noted that each of the fluidic micropipe interconnect 210, the waveguide interconnect 220, and the electrical lead interconnect 230, can be the same or a different heights depending on the configuration and application of the structure 200a.

The fluidic micropipe interconnect 210 is substantially perpendicular to the first substrate 202. The fluidic micropipe interconnect 210 is adapted to flow a fluid through the surface-normal fluidic micropipe interconnect 210. In particular, the fluidic micropipe interconnect 210 is in fluid communication with a micropipe 216 disposed within the substrate 202. The micropipe 216 can be part of a fluidic architecture used to remove thermal energy from the system in which it is used.

The fluidic micropipe interconnect 210 includes, but is not limited to, a micropipe wall 212 and optionally, a metal layer 214. It should be noted that other embodiments do not include the metal layer 214. It should also be noted that other embodiments include a dielectric layer in place of the metal layer 214.

The micropipe wall 212 can have dimensions similar to the micropipe walls described herein. The micropipe wall 212 can be made of materials similar to the materials used to make the micropipes described herein. The metal layer 214 can have a thickness of about 0.1 to 500 µm. The metal layer 214 can be made of a metal such as, but not limited to, copper, gold, nickel, solder, and combinations thereof. In another embodiment, the fluidic micropipe interconnect 210 may only include a micropipe wall made of a metal or polymer material.

The waveguide interconnect 220 functions to communicate optical energy between the first structure 200a and the second structure 300a. The waveguide interconnect 220 includes, but is not limited to, a pillar 222 and a reflective component 224 disposed at the non-flat tip of the pillar 222. The pillar 222 is in optical communication with an optical component 226 disposed within the substrate 202. The optical component can include optical components as described herein. In another embodiment, the pillar 222 could have a flat tip, as opposed to a non-flat tip, or a non-flat tip with a different geometry. The reflective component can be a mirror formed of mirror material such as, but not limited to, a slanted polymer coated with a metal film, and unmetallized slants for total internal reflection mirrors. In another embodiment, the reflective component 224 can direct optical energy in two directions.

The waveguide interconnect 220 can have a height of about 5 to 500 µm and a diameter of about 3 to 500 µm and 3 to 5000 µm. The pillar 222 can be made of materials capable of optical transmission as described herein in reference to pillar 14. It should be noted that other surface-normal waveguide interconnects can be used in other embodiments not shown here.

The electrical lead interconnect 230 transversely extends from the first substrate 202. The electrical lead interconnect 230 is adapted to communicate electrical energy. The electrical lead interconnect 230 includes, but is not limited to, a pillar 232, a lead 234 disposed on the pillar 232, and a die pad 236. It should be noted other types of electrical lead interconnect 230 can be used as well. The pillar 232 can be made of materials described herein. The lead 234 can be fabricated of one or more layers of metals, metal composites, conductive adhesives, or combinations thereof, appropriate for the electrical lead interconnect 230. The metals and metal composites include, but are not limited to, gold, gold alloys, copper, and copper alloys.

The electrical lead interconnect 230 can have a height of about 5 to 500 µm and a diameter of about 3 to 500 µm. It should be noted other electrical lead interconnects could be used in other embodiments not shown here.

The first substrate 202 can include about 10 waveguide and electrical lead interconnects 220 and 230 to about 500,000 waveguide and electrical lead interconnects 220 and 230 per centimeter squared of the first substrate 202. The first substrate 202 can include about 10,000 waveguide and electrical lead interconnects 220 and 230 to about 500,000 waveguide and electrical lead interconnects 220 and 230 per centimeter squared of the first substrate 202. The first substrate 202 can include about 100,000 waveguide and electrical lead interconnects 220 and 230 to about 500,000 waveguide and electrical lead interconnects 220 and 230 per centimeter squared of the first substrate 202. It should also be noted that the first substrate 202 can include from about 2 to 500,000 fluidic micropipe interconnects per centimeter squared of the first substrate 202, in addition to the waveguide and electrical lead interconnects.

The second structure 300a includes the second substrate 302, which is similar to other substrates (e.g., substrate 12) described herein. The second structure 300a includes, but is not limited to, a fluidic connector 310, a waveguide connector 320, an electrical lead connector 330.

The fluidic connector 310 is adapted to receive the fluidic micropipe interconnect 210. The fluidic micropipe interconnect 210 is configured to flow a fluid 218 between the first structure 200a and the second structure 300a. In this regard, the first substrate 202 and the second substrate 302 are adapted to transfer thermal energy through the fluidic micropipe interconnect 210, the fluidic connector 310, and the micropipes 216 and 316.

The dimensions of the fluidic connector 310 are similar to that of the fluidic micropipe interconnect 210, so that it can receive the fluidic micropipe interconnect 210. A solder material (not shown) described herein can be used to bond the fluidic micropipe interconnect 210 to the fluidic connector 310. It should be noted that other fluidic connector could be used in other embodiments not shown. It should also be noted that an underfill could be used herein. In should also be noted that localized heating can be used to partially melt and attach the pipes.

The waveguide connector 320 is adapted to receive the surface-normal waveguide interconnect 220. The waveguide interconnect 220 is adapted to communicate optical energy between the first structure 200a and the second structure 300a. An optical energy can be reflected by the reflective component 224 into an optical component 326 within the second substrate 302. The dimensions of the waveguide connector 320 are similar to the waveguide interconnect 220 to receive the waveguide interconnect 220. A solder material (not shown) described herein can be used to bond the waveguide interconnect 220 with the waveguide connector 320. It should be noted that other waveguide connectors could be used in other embodiments not shown.

The electrical lead connector 330 (e.g., a die pad) is adapted to receive the electrical lead interconnect 230. The electrical lead interconnect 230 and the electrical lead connector 330 are adapted to communicate electrical energy between the first structure 200a and the second structure 300a. It should be noted that other electrical lead connectors 330 can be used in other embodiments not shown.

Embodiments of the disclosure include using the highly perpendicular interconnects of a first structure (e.g., first structure 200a) to transport electrical energy, optical energy, and fluids via the I/O interconnections.

Embodiments of the disclosure include fabricating highly perpendicular electrical, optical, and fluidic I/O interconnects adjacent to each other on a first substrate (e.g., first structure 200a) and a second structure 300a.

Embodiments of the disclosure include assembling electrical, optical, and fluidic I/O interconnects simultaneously and using a flip-chip bonder.

Embodiments of the disclosure include a method of connecting two parallel surfaces using highly perpendicular electrical, optical, and fluidic I/O interconnects.

Embodiments of the disclosure include a method of using a micropipe to transport fluids into and out of substrate (or chip/die) where the micorpipe is located on the side of the chip where electrical die pads are located.

Embodiments of the disclosure include a method of circulating a fluid over the surface of a substrate or chip by using planar fluidic channels that are connected to highly perpendicular micropipes.

Embodiments of the disclosure include a method of using flip-chip bonders to assemble chips with micropipes.

For the purposes of illustration only, and without limitation, embodiments of the present disclosure will be described with particular reference to the below-described fabrication methods. Note that not every step in the process is described with reference to the process described in the figures hereinafter. Therefore, the following fabrication processes are not intended to be an exhaustive list that includes every step required to fabricate the embodiments of the illustrated components. In addition, the steps of the process can be performed in a different order to accomplish the same result.

Figure 12A:
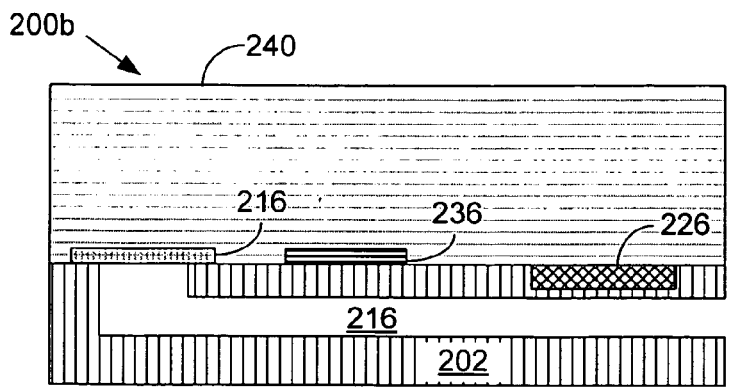
FIGS. 12A through 12D illustrate the fabrication of the first structure similar to the one shown in FIG. 11A.

FIGS. 12A through 12D illustrate the fabrication of the first structure similar to the one shown in FIG. 11A. FIG. 12A illustrates a substrate 202 having a micropipe 216. In addition, the substrate 202 includes an optical component 226 disposed within the substrate 202, while a die pad 236 and a protective layer 216 are disposed on the substrate 202. The protective layer 216 is disposed on top of an opening of the micropipe 216. Furthermore, a polymer layer 240 is disposed on the substrate 202, optical component 226, die pad 236, and protective layer 216.

The polymer layer 240 can include material such as, but not limited to, polymers described herein with regard to the pillar.

The protective layer 216 can include materials such as, but not limited to, silicon dioxide, nitrides, and polymers (as described herein). The protective layer 216 can have a thickness of about 0.1 µm to 5 µm.

Figure 12B:
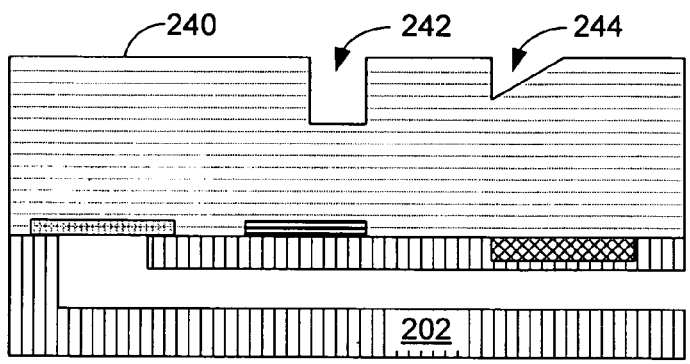

FIG. 12B illustrates the molding of the polymer layer 240 using heat and/or pressure and a molding structure. The molding forms two indentions (242 and 244) in the polymer layer 240.

Figure 12C:
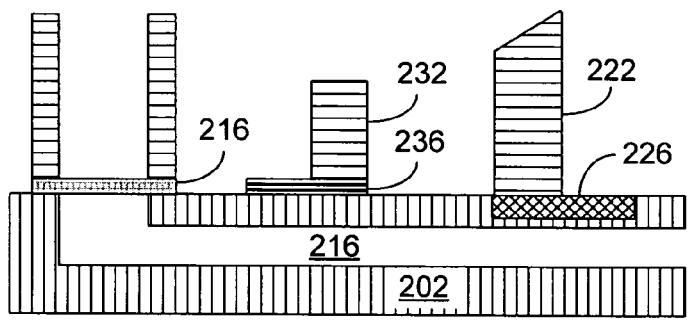

FIG. 12C illustrates the removal of portions of the polymer layer 240. The removal forms structures 212, 232, and 222, which are the precursor structures of the fluidic micropipe interconnect 210, the surface-normal waveguide interconnect 220, and the electrical lead interconnect 230. The polymer layer 240 can be removed by techniques such as, but not limited to, photoimaging and photolithography.

Figure 12D:
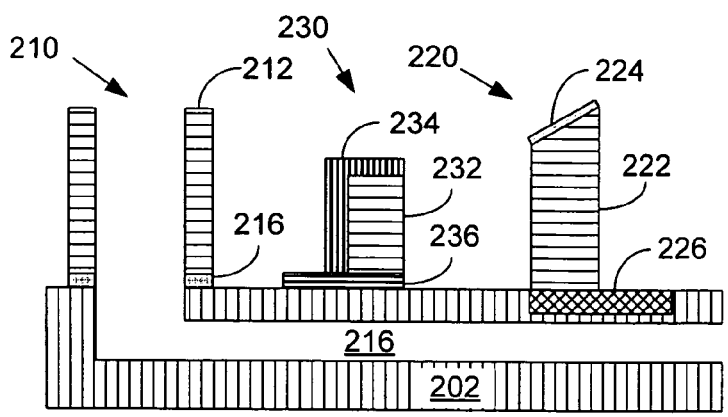

FIG. 12D illustrates the removal of the portion of the protective layer 216 over the opening of the micropipe 216.

Figure 13:
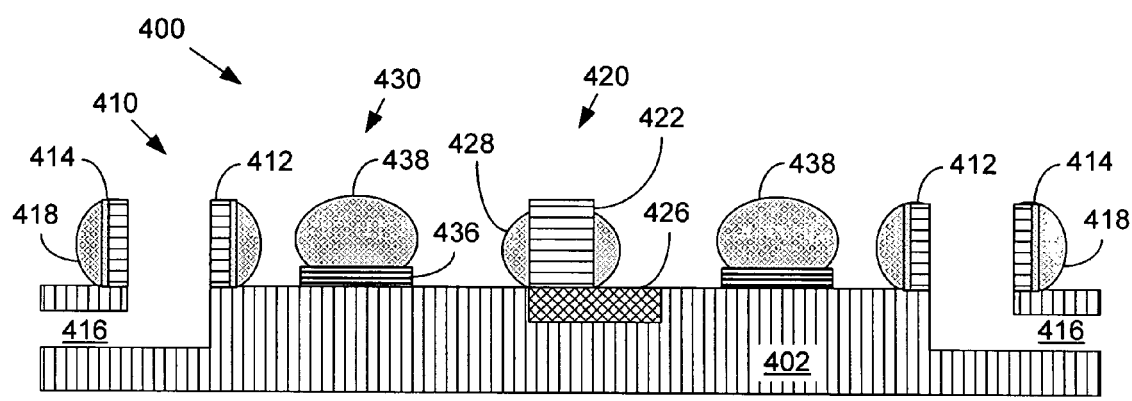
FIG. 13 illustrates another embodiment of a first structure similar to the first structure in FIGS. 11A and 11B.

FIG. 13 illustrates another embodiment of a first structure 400 similar to the first structure 200a. The first structure 400 includes, but is not limited to, a fluidic micropipe interconnect 410, a surface-normal waveguide interconnect 420, and an electrical contact 430.

The fluidic micropipe interconnect 410 includes, but is not limited to a micropipe wall 412 and, optionally, a metal layer 414. The micropipe wall 412 can have dimensions similar to the micropipe walls described herein. The micropipe wall 412 can be made of materials similar to the materials used to make the micropipes and pillars described herein. The metal layer 414 can have a thickness of about 0.1 µm to 500 µm. The metal layer 414 can be made of a metal such as, but not limited to, copper, gold, nickel, solder, and combinations thereof. In another embodiment, the fluidic micropipe interconnect 410 may only include a micropipe wall made of a metal or polymer material as described herein.

A solder material 418 is disposed on the metal layer 414. The solder material 418 can be electroplated, evaporated, or printed on the surface. The solder forms into balls after reflow. Solder thickness must be sufficiently thick to allow balling. The thickness depends on the height, but can be from about 15–100 µm.

The surface-normal waveguide interconnect 420 functions to communicate optical energy. The surface-normal waveguide interconnect 420 includes, but is not limited to, a pillar 422.

A solder material 428 is disposed on the surface-normal waveguide interconnect 420. The solder material 428 can be electroplated, evaporated, or printed on the surface. The solder forms into balls after reflow. Solder thickness must be sufficiently thick to allow balling. The thickness depends on the height, but can be from about 15–100 µm.

The electrical contact 430 includes a die pad 436 and a solder material 438 disposed thereon. The solder materials are those used in industry. The solder material 438 can be about 10 µm to 500 µm wide.

Metal Pad Electrical and Optical Interconnects

Metal interconnect pads that can be used as electrical and optical interconnects are advantageous when using dual electrical/optical interconnects positioned on a separate substrate. The metal interconnect pad (e.g., a copper I/O pad) includes an opening through the metal interconnect pad. When the metal interconnect pad is positioned on a substrate, the substrate has an optical component positioned substantially under the opening of the metal interconnect pad. Once a dual optical/electrical I/O interconnect is positioned to contact the metal interconnect pad, the optical signal is communicated through the opening of the metal interconnect pad to the optical component in the substrate. In addition, the electrical signal is communicated through the metal portion of the metal interconnect pad. A solder material can be used to bond the metal interconnect pad to the dual optical/electrical I/O interconnect. It should be noted that an optical or an electrical I/O interconnect can be used as with the metal interconnect pads as well.

Figure 14A:
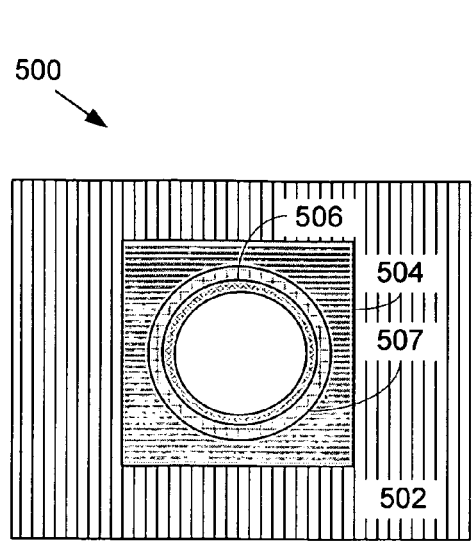
FIGS. 14A through 14C illustrate the metal interconnect pad.
Figure 14B:
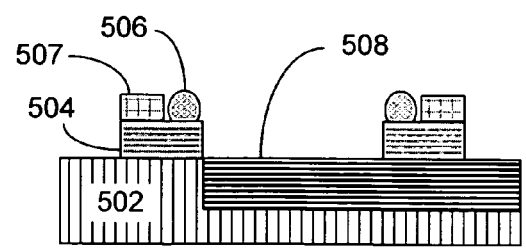
Figure 14C:
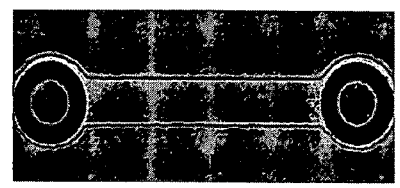

FIGS. 14A through 14C illustrate the metal interconnect pad 500. FIG. 14A illustrates a top view of the metal interconnect pad 500, while FIG. 14B illustrates a cross section view of the metal interconnect pad 500. FIG. 14C illustrates a top view of an actual metal interconnect pad.

The metal interconnect pad 500 includes, but is not limited to, a substrate 502 (similar to substrate 12 described herein) having a metal pad 504 having an opening therein and a solder material 506 disposed adjacent the opening and on the metal pad 504. A blocking layer 507 can be used to prevent the solder material 506 from flowing off of the metal pad 504. An optical component 508 is disposed, at least in part, under the opening of the metal pad 504. The optical component 508 can include, but is not limited to, waveguides, mirrors, lenses, grating couplers, optoelectronics devices (e.g., detectors), emitters (e.g., VCSELs and LEDs). The metal pad 504 can be made of materials such as, but not limited to, copper, nickel, solder, gold, and combinations thereof. The metal pad 504 can be about 0.1 to 500 μm across and 3 to 500 μm and 3 to 5000 μm in length. The metal pads 504 dimensions depend, at least in part, on the pillar diameter. The solder material 506 can be a solder material as described herein.

Figure 15A:
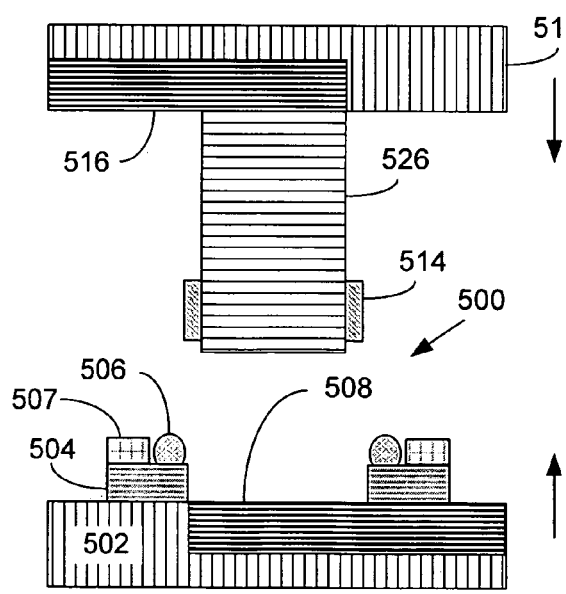
FIGS. 15A and 15B illustrate the coupling of the metal interconnect pad with an optical I/O interconnect.
Figure 15B:
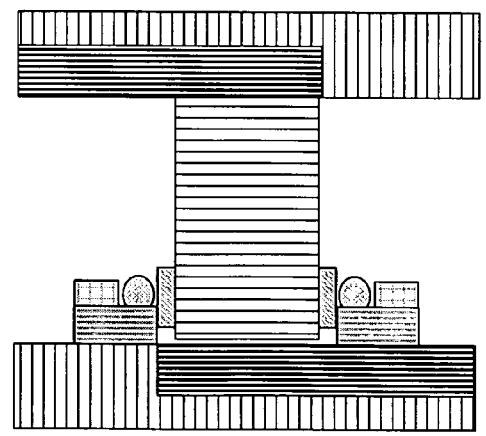

FIGS. 15A and 15B illustrate the coupling of the metal interconnect pad 500 with an optical I/O interconnect. FIG. 15A illustrates the metal interconnect pad 500 as shown in FIGS. 14A and 14B. In addition, FIG. 15A illustrates a second substrate having an optical I/O interconnect 526. The optical I/O interconnect 526 is in optical communication with a waveguide 516 disposed within the substrate 512 (similar to the substrate 12 described herein). A metal layer 514 (similar to the metal layer 26 described herein) is disposed on the optical I/O interconnect 526. FIG. 15B illustrates the coupling of the metal interconnect pad 500 with the optical I/O interconnect 526. The solder material 506 can bond with the metal layer 514. An optical signal can be communicated between the optical component 508 and the waveguide 516 through the optical I/O interconnect 526. In order to provide index matching (remove air gap separation) between the pillar and waveguide/device, an index matching material may be used.

The above assembly technology can also be used to create an electrical/fluidic interconnetion instead of an electrical/optical interconnection. In this embodiment, the substrate could include an appropriate micropipe architecture.

Compliant Socket Interconnects

Figure 16A:
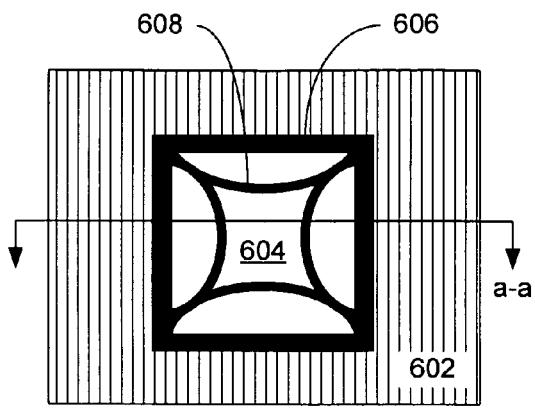
FIGS. 16A and 16B illustrate a socket that is adapted to receive a pillar or a pin.
Figure 16B:
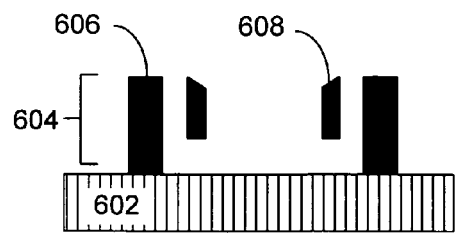

FIGS. 16A and 16B illustrate a socket 604 that is adapted to receive a pillar or a pin. The socket 604 is disposed on a substrate 602 (similar to the substrates 12 described herein). The socket 604 includes a outer socket 606 and inner curved sidewalls 608. The socket 604 has a funnel-like opening to enhance pin-to-socket alignment. While the outer socket 606 is one structure, the inner curved sidewalls 608 are designed to be compliant by having a distinct shape (e.g., the one shown in FIG. 16A) which is not adhered to the bottom of the substrate 602, thereby being more compliant than if attached at the bottom. The socket 604 can be made of a material such as, but not limited to, polymeric material, metallic material, or fabricated directly into a substrate such as Si, for example. In addition, the socket can be used to receive solder and be used as a probe device for wafer-level testing.

For the purposes of illustration only, and without limitation, embodiments of the present disclosure will be described with particular reference to the below-described fabrication methods. Note that not every step in the process is described with reference to the process described in the figures hereinafter. Therefore, the following fabrication processes are not intended to be an exhaustive list that includes every step required to fabricate the embodiments of the illustrated components. In addition, the steps of the process can be performed in a different order to accomplish the same result.

Figure 17A:
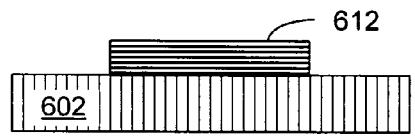
FIG. 17 through 17E illustrate the fabrication f the socket shown in FIGS. 16A and 16B.

FIGS. 17A through 17E illustrate the fabrication of the socket 604 shown in FIGS. 16A and 16B. FIG. 17A illustrates a sacrificial material 612 disposed on a portion of the substrate 602. The sacrificial material 612 can include materials such as, but not limited to, resists, metal, organic dielectrics, inorganic dielectrics, and combinations thereof.

Figure 17B:
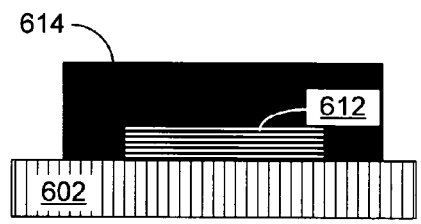

FIG. 17B illustrates a polymer layer 614 disposed on the substrate 602 and the sacrificial material 612. The polymer layer 614 can be made of a polymer selected from polymers such as, but not limited to, polymers similar to those described herein.

Figure 17C:
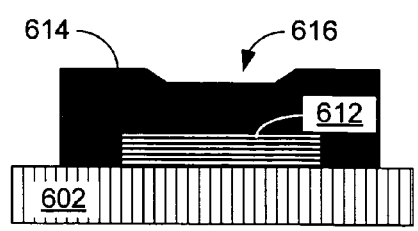

FIG. 17C illustrates the molding of a portion 616 of the polymer layer 614 using heat and/or pressure.

Figure 17D:
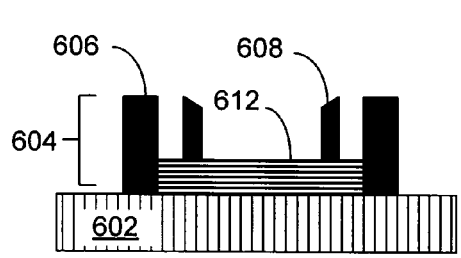
Figure 17E:
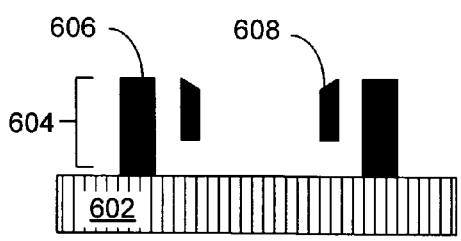

FIG. 17D illustrates the etching of the polymer layer 614 to form the socket 604 using, for example, photoimaging, while FIG. 17E illustrates the removal of the sacrificial material 612 so that the inner portion 608 of the socket 604 is not connected to the substrate 602.

Gear-Teeth Patterned Pillar Interconnects

Figure 18A:
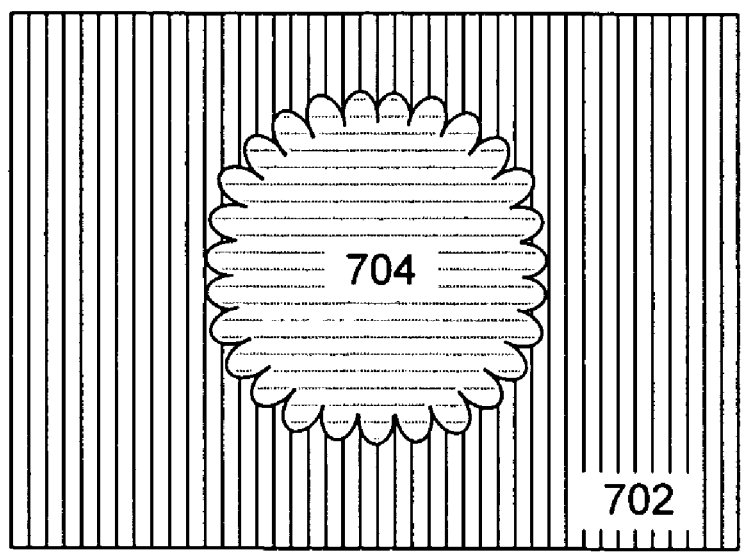
FIGS. 18A and 18B illustrate a polymer pin with a patterned sidewall to resemble a gear-teeth pattern using photoimaging on a substrate.
Figure 18B:
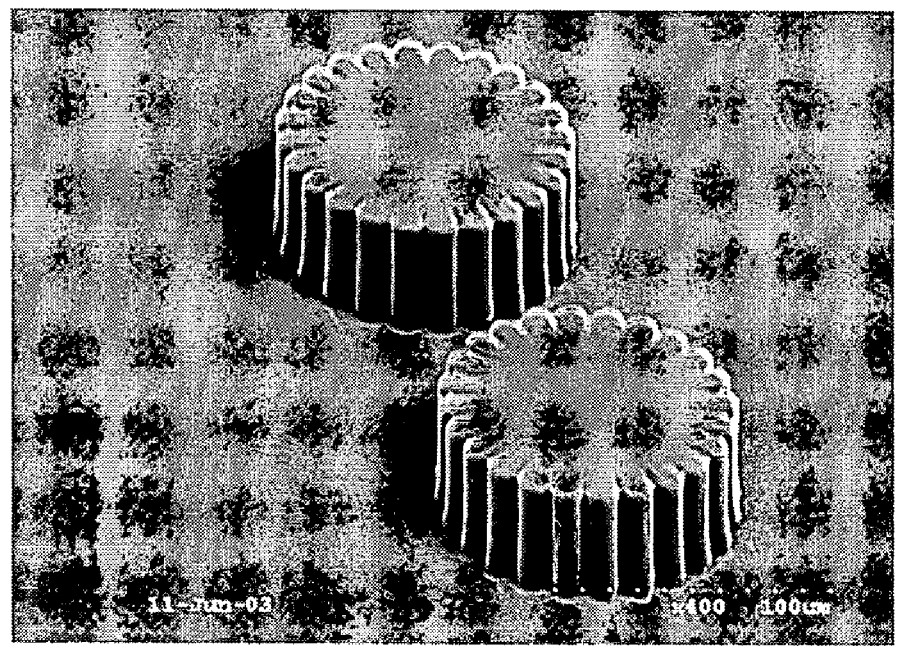

FIG. 18A illustrates a polymer pin 704 with a patterned sidewall to resemble gear-teeth pattern using photoimaging or photolithography on a substrate 702 (the substrate is similar to substrates 12 described herein). FIG. 18B is an illustration of an actual polymer pin 704. It should be noted that each of the I/O interconnects described above can have similar sidewall pattern depending on the application.

It should be emphasized that the above-described embodiments of the present disclosure are merely possible examples of implementations, and are merely set forth for a clear understanding of the principles of the disclosure. Therefore, many variations and modifications may be made to the above-described embodiment(s) of the disclsoure without departing substantially from the spirit and principles disclosed herein. All such modifications and variations are intended to be included herein within the scope of this disclosure and protected by the following claims.

The invention claimed is:

1. An electrical, optical, and fluidic input/output (I/O) interconnect system, comprising:
 a first substrate comprising:
  a surface-normal waveguide interconnect, wherein the first substrate is adapted to communicate optical energy through the waveguide interconnect,
  a surface-normal electrical lead interconnect, wherein the first substrate is adapted to communicate electrical energy through the electrical lead interconnect, and
  a surface-normal fluidic micropipe interconnect, wherein the fluidic micropipe interconnect is configured to transport a fluid, and wherein the first substrate is adapted to flow fluids through the fluidic micropipe interconnect.

2. The I/O interconnect system of claim 1, further comprising:
 a second substrate including:
  a waveguide connector adapted to receive the waveguide interconnect, wherein the waveguide interconnect is adapted to communicate optical energy between the first substrate and the second substrate,
  an electrical lead connector adapted to receive the electrical lead interconnect, wherein the electrical lead interconnect is adapted to communicate electrical energy between the first substrate and the second substrate, and a fluidic connector adapted to receive the fluidic micropipe interconnect, wherein the fluidic micropipe interconnect is configured to flow a fluid between the first substrate and the second substrate, and wherein the first substrate and the second substrate are adapted to communicate the fluid through the fluidic micropipe interconnect.

3. The I/O interconnect system of claim 1, wherein two or more of the waveguide interconnect, the fluidic micropipe interconnect, and the electrical lead interconnect have different heights.

4. The I/O interconnect system of claim 1, wherein the fluidic micropipe interconnect comprises walls made from a polymer material selected from one of the following: polyimides, epoxides, polynorbornenes, polyarylene ethers, and parylenes.

5. The I/O interconnect system of claim 4, wherein the fluidic micropipe interconnect comprises a dielectric material disposed on the outside of the walls of the polymer material.

6. The I/O interconnect system of claim 4, wherein the fluidic micropipe interconnect comprises a metal layer disposed on a portion of the outside of the walls of the polymer material.

7. The I/O interconnect system of claim 6, wherein a solder material is disposed on the metal layer.

8. The I/O interconnect system of claim 1, wherein the fluidic micropipe interconnect comprises walls made from a metal layer.

9. The I/O interconnect system of claim 1, wherein the fluidic micropipe interconnect has a height of about 15 to 500 micrometers.

10. The I/O interconnect system of claim 1, wherein the fluidic micropipe interconnect has a diameter of about 3 to 5,000 micrometers.

11. The I/O interconnect system of claim 1, wherein the one or more of the waveguide interconnect, the fluidic micropipe interconnect, and the electrical lead interconnect are substantially perpendicular to the first substrate.

12. The I/O interconnect system of claim 1, wherein the first substrate has from about 10 waveguide interconnects and electrical lead interconnects to about 500,000 waveguide interconnects and electrical lead interconnects per centimeter squared of the first substrate.

13. The I/O interconnect system of claim 1, wherein the first substrate has from about 100,000 waveguide interconnects and electrical lead interconnects to about 500,000 waveguide interconnects and electrical lead interconnects per centimeter squared of the first substrate.

14. The I/O interconnect system of claim 1, wherein the fluidic micropipe interconnect includes a non-flat tip at an end opposite the first substrate.

15. The I/O interconnect system of claim 1, wherein the waveguide interconnect comprises a low modulus material selected from polyimides, epoxides, polynorbornenes, polyarylene ethers, and parylenes.

16. The I/O interconnect system of claim 15, wherein the fludic connector includes a material that secures the fludic micropipe interconnect to the fludic connector.

17. The I/O interconnect system of claim 1, further comprising an element selected from one of the following: a diffractive grating coupler disposed on the surface-normal waveguide interconnect at an end opposite the first substrate and a mirror disposed on the surface-normal waveguide interconnect at an end opposite the first substrate.

18. The I/O interconnect system of claim 17, wherein the coupling element is selected from a volume grating coupling element and a surface relief grating coupling element.

19. The I/O interconnect system of claim 2, further comprising an element selected from one of the following: a diffractive grating coupler disposed within the second substrate and a mirror disposed within the second substrate.

20. The I/O interconnect system of claim 1, wherein the fluidic micropipe interconnect comprises walls made of metal.

21. The I/O interconnect system of claim 1, wherein the fluidic micropipe interconnect has a height of about 5 to 500 micrometers.

22. A method for forming a device comprising:
providing a first substrate, wherein the first substrate comprises:
a surface-normal waveguide interconnect, wherein the first substrate is adapted to communicate optical energy through the waveguide interconnect,
a surface-normal electrical lead interconnect, wherein the first substrate is adapted to communicate electrical energy through the electrical lead interconnect, and
a surface-normal fluidic micropipe interconnect, wherein the fluidic micropipe interconnect is configured to transport a fluid, and wherein the first substrate is adapted to flow fluids through the fluidic micropipe interconnect;
providing the second substrate, wherein the second substrate comprises:
a waveguide connector adapted to receive the waveguide interconnect, wherein the waveguide interconnect is adapted to communicate optical energy between the first substrate and the second substrate
an electrical lead connector adapted to receive the electrical lead interconnect, wherein the electrical lead interconnect is adapted to communicate electrical energy between the first substrate and the second substrate, and
a fluidic connector adapted to receive the fluidic micropipe interconnect, wherein the fluidic micropipe interconnect is configured to flow a fluid between the first substrate and the second substrate, and wherein the first substrate and the second substrate are adapted to communicate the fluid through the fluidic micropipe interconnect;
causing the waveguide connector to receive a portion of the waveguide interconnect;
causing the electrical lead connector to receive a portion of the electrical lead interconnect; and
causing the fludic connector to receive a portion of the fluidic micropipe interconnect.

23. The method of claim 22, wherein the first substrate and the second substrate are caused to contact one another using a flip chip bonder.

24. A method of directing fluids, optical energy, and electrical energy, comprising:
providing a first substrate, wherein the first substrate comprises:
a surface-normal waveguide interconnect, wherein the first substrate is adapted to communicate optical energy through the waveguide interconnect,
a surface-normal electrical lead interconnect, wherein the first substrate is adapted to communicate electrical energy through the electrical lead interconnect, and
a surface-normal fluidic micropipe interconnect, wherein the fluidic micropipe interconnect is configured to transport a fluid, and wherein the first substrate is adapted to flow fluids through the fluidic micropipe interconnect;
providing a second substrate, wherein the second substrate comprises:
a waveguide connector adapted to receive the waveguide interconnect, wherein the waveguide interconnect is adapted to communicate optical energy between the first substrate and the second substrate, an electrical lead connector adapted to receive the electrical lead interconnect, wherein the electrical lead interconnect is adapted to communicate electrical energy between the first substrate and the second substrate, and a fluidic connector adapted to receive the fluidic micropipe interconnect, wherein the fluidic micropipe interconnect is configured to flow a fluid between the first substrate and the second substrate, and wherein the first substrate and the second substrate are adapted to communicate the fluid through the fluidic micropipe interconnect;

communicating optical energy between the waveguide interconnect of the first substrate and the second substrate;

communicating electrical energy between the electrical lead interconnect of the first substrate and the second substrate; and flowing a fluid between the first substrate and the second substrate through the fluidic micropipe interconnect.

25. A method of forming an electrical, optical, and fluidic input/output (I/O) interconnect system, comprising:
providing a first substrate;
simultaneously forming a surface-normal waveguide interconnect, a surface-normal electrical lead interconnect, and a surface-normal fluidic micropipe interconnect, adjacent one another on the first substrate.

26. A fluidic input/output (I/O) interconnect system, comprising:
a first substrate comprising a surface-normal fluidic micropipe interconnect, wherein the fluidic micropipe interconnect is configured to transport a fluid, wherein the first substrate is incorporated into a structure selected from one of the following: microprocessor, microelectronic chip, Application Specific Integrated Circuit (ASICs) chip, System-on-a-Chip (SoC), architecture chip, optoelectronic chip, hybrid optoelectronic/microelectronic chip, bioengineering, and combinations thereof, and wherein the first substrate comprises a second interconnect selected from: an electrical interconnect, an optical interconnect interfaced with a waveguide, a dual electrical/optical interconnect interfaced with a waveguide, and combinations thereof.

27. The fluidic I/O interconnect system of claim 26, wherein the fluidic micropipe interconnect comprises walls made from a polymer material selected from one of the following: polyimides, epoxies, polynorbornenes, polyarylene ethers, and parylenes.

28. The fluidic I/O interconnect system of claim 27, wherein the fluidic micropipe interconnect comprises a metal layer disposed on the outside of the walls of the polymer material.

29. The fluidic I/O interconnect system of claim 28, wherein a solder material is disposed on the metal layer.

30. The fluidic I/O interconnect system of claim 26, wherein the fluidic micropipe interconnect comprises walls made from a metal layer.

31. The fluidic I/O interconnect system of claim 26, wherein a top of the fluidic micropipe interconnect is non-flat.

32. The fluidic I/O interconnect system of claim 26, wherein the fluidic micropipe interconnect has a height of about 15 to 300 micrometers.

33. The fluidic I/O interconnect system of claim 26, wherein the fluidic micropipe interconnect has a diameter of about 3 to 5,000 micrometers.

34. A method of circulating a fluid, comprising:
providing the first substrate of claim 26, wherein the first substrate includes a micropipe within the first substrate, and
flowing the fluid through the micropipe and the fluidic micropipe interconnect.

35. An input/output (I/O) interconnect, comprising:
a first substrate comprising a surface-normal compliant pillar extending from the first substrate, wherein the compliant pillar has a length of about 5 to 500 micrometers, and a width of about 2 to 5000 micrometers, wherein the compliant pillar has a metal layer disposed on a portion of the compliant pillar, wherein a dielectric material separates the compliant pillar and the metal layer, wherein the metal layer has a thickness of about 0.1 to 100 micrometers, and wherein the compliant pillar is a polymer material selected from one of the following: polyimides, epoxies, polynorbornenes, polyarylene ethers, and parylenes.

36. The I/O interconnect of claim 35, wherein the metal layer is disposed on the top of the compliant pillar and around the side walls of the compliant pillar, forming a metal cap on the compliant pillar.

37. The I/O interconnect of claim 36, further comprising a solder material disposed on the metal cap.

38. The I/O interconnect of claim 35, wherein the metal layer is disposed on a portion of the side walls of the compliant pillar, wherein the metal layer is not disposed on the top of the compliant pillar, and wherein the metal layer forms a metal ring.

39. The I/O interconnect of claim 38, further comprising a solder material disposed on the metal layer.

40. The I/O interconnect of claim 39, further comprising a blocking layer disposed on the side walls of the compliant pillar and on the first substrate, wherein the diameter of the blocking layer is greater than the diameter of the metal layer, wherein the solder material is disposed on the top of the blocking layer.

41. The I/O interconnect of claim 35, wherein the compliant pillar is a waveguide.

42. An I/O interconnect system, comprising:
a first substrate comprising a metal interconnect pad and a first optical component, wherein the metal interconnect pad is positioned over the first optical component, wherein the metal interconnect pad has an opening through the metal interconnect pad, and wherein the opening in the metal interconnect pad exposes the first optical component; and a second substrate comprising a surface-normal waveguide extending from the second substrate and a second optical component in optical communication with the waveguide, wherein the waveguide is positioned adjacent the first optical component of the first substrate through the opening, wherein the first optical component and the second optical component are in optical communication through the waveguide, wherein an electronic lead is disposed on a portion of the wall of the waveguide, wherein the electronic lead electronically contacts the metal interconnect pad so that the first substrate and the second substrate are in electrical communication.

43. The I/O interconnect of claim 42, further comprising a solder material disposed on the metal interconnect pad adjacent the opening.

44. The I/O interconnect of claim 43, wherein the first optical component and the second optical component are each independently selected from one of the following: a waveguide, an optical energy source, a detector, and combinations thereof.

45. An input/output (I/O) interconnect system, comprising:
 a first substrate comprising at least two of the following types of interconnects:
  a surface-normal waveguide interconnect, wherein the first substrate is adapted to communicate optical energy through the waveguide interconnect,
  a surface-normal electrical lead interconnect, wherein the first substrate is adapted to communicate electrical energy through the electrical lead interconnect, and
  a surface-normal fluidic micropipe interconnect, wherein the fluidic micropipe interconnect is configured to transport a fluid, and wherein the first substrate is adapted to flow fluids through the fluidic micropipe interconnect.

46. The I/O interconnect system of claim 45, further comprising:
 a second substrate including at least two of the following types of connectors corresponding to the interconnects on the first substrate:
  a waveguide connector adapted to receive the waveguide interconnect, wherein the waveguide interconnect is adapted to communicate optical energy between the first substrate and the second substrate,
  an electrical lead connector adapted to receive the electrical lead interconnect, wherein the electrical lead interconnect is adapted to communicate electrical energy between the first substrate and the second substrate, and
  a fluidic connector adapted to receive the fluidic micropipe interconnect, wherein the fluidic micropipe interconnect is configured to flow a fluid between the first substrate and the second substrate, and wherein the first substrate and the second substrate are adapted to communicate the fluid through the fluidic micropipe interconnect.

47. The I/O interconnect system of claim 46, wherein the first substrate includes the surface-normal electrical lead interconnect and the surface-normal fluidic micropipe interconnect; and the second substrate includes the electrical lead connector and the fluidic connector.

48. The I/O interconnect system of claim 46, wherein the first substrate includes the surface-normal waveguide interconnect and the surface-normal fluidic micropipe interconnect; and the second substrate includes the waveguide connector and the fluidic connector.

49. An input/output (I/O) interconnect system, comprising:
 a first substrate and a second substrate, wherein one of the first substrate or the second substrate includes at least two types of interconnects and at least one type of connector selected from: a surface-normal waveguide interconnect, a surface-normal electrical lead interconnect, a surface-normal fluidic micropipe interconnect, a waveguide connector, an electrical lead connector, and a fluidic connector, wherein the other of the first substrate and the second substrate include at least two types of connectors and at least one type of interconnect,
 wherein if the first substrate includes one type of interconnect, the second substrate includes a corresponding connector, wherein if the first substrate includes one type of connector, the second substrate includes a corresponding interconnect wherein the first substrate is adapted to communicate optical energy through the waveguide interconnect,
 wherein the first substrate is adapted to communicate electrical energy through the electrical lead interconnect, wherein the fluidic micropipe interconnect is configured to transport a fluid, and wherein the first substrate is adapted to flow fluids through the fluidic micropipe interconnect, wherein the waveguide interconnect is adapted to communicate optical energy between the first substrate and the second substrate, wherein the electrical lead interconnect is adapted to communicate electrical energy between the first substrate and the second substrate, and wherein the fluidic micropipe interconnect is configured to flow a fluid between the first substrate and the second substrate, and wherein the first substrate and the second substrate are adapted to communicate the fluid through the fluidic micropipe interconnect.

50. An input/output (I/O) interconnect system, comprising:
 a first substrate comprising at least two of the following types of interconnects:
  a surface-normal waveguide interconnect, wherein the first substrate is adapted to communicate optical energy through the waveguide interconnect,
  a solder bump lead interconnect, wherein the first substrate is adapted to communicate electrical energy through the solder bump interconnect, and
  a surface-normal fluidic micropipe interconnect, wherein the fluidic micropipe interconnect is configured to transport a fluid, and wherein the first substrate is adapted to flow fluids through the fluidic micropipe interconnect.

51. The I/O interconnect system of claim 50, further comprising:
 a second substrate including at least two of the following types of connectors corresponding to the interconnects on the first substrate:
  a waveguide connector adapted to receive the waveguide interconnect, wherein the waveguide interconnect is adapted to communicate optical energy between the first substrate and the second substrate,
  an electrical lead connector adapted to receive the solder bump interconnect, wherein the solder bump interconnect is adapted to communicate electrical energy between the first substrate and the second substrate, and
  a fluidic connector adapted to receive the fluidic micropipe interconnect, wherein the fluidic micropipe interconnect is configured to flow a fluid between the first substrate and the second substrate, and wherein the first substrate and the second substrate are adapted to communicate the fluid through the fluidic micropipe interconnect.

52. The I/O interconnect system of claim of 51, wherein an optical adhesive glues the surface-normal waveguide interconnect to the waveguide connector.

* * * * *